(12) United States Patent
Jangjian et al.

(10) Patent No.: US 11,189,727 B2
(45) Date of Patent: Nov. 30, 2021

(54) FINFET CONTACTS AND METHOD FORMING SAME

(71) Applicant: Taiwan Semiconductor Manufacturing Company, Ltd., Hsinchu (TW)

(72) Inventors: Peng-Chung Jangjian, Zhudong Township (TW); Kao-Feng Liao, Hsinchu (TW); Chun-Wen Hsiao, Hsinchu (TW); Hsin-Ying Ho, Kaohsiung (TW); Sheng-Chao Chuang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/549,093

(22) Filed: Aug. 23, 2019

(65) Prior Publication Data

US 2021/0057571 A1 Feb. 25, 2021

(51) Int. Cl.
*H01L 21/768* (2006.01)
*H01L 29/78* (2006.01)
(Continued)

(52) U.S. Cl.
CPC ...... *H01L 29/785* (2013.01); *H01L 21/76816* (2013.01); *H01L 21/76877* (2013.01);
(Continued)

(58) Field of Classification Search
CPC ... H01L 21/76; H01L 21/70; H01L 29/41791; H01L 29/66545; H01L 21/7897; H01L 29/66795; H01L 21/823475; H01L 29/785; H01L 21/76895; H01L 29/0847; H01L 21/823431; H01L 27/0886; H01L 21/76834; H01L 27/088; H01L 2924/0002; H01L 29/401; H01L 29/6656; H01L 23/5226; H01L 23/485; H01L 23/528;
(Continued)

(56) References Cited

U.S. PATENT DOCUMENTS 9,105,490 B2 8/2015 Wang et al.
9,236,267 B2 1/2016 De et al.
(Continued)

FOREIGN PATENT DOCUMENTS

KR 20180097932 A * 9/2018

*Primary Examiner* — Samuel Park
(74) *Attorney, Agent, or Firm* — Slater Matsil, LLP

(57) ABSTRACT

A device includes a semiconductor fin protruding from a substrate, a first gate stack over the semiconductor fin and a second gate stack over the semiconductor fin, a first source/drain region in the semiconductor fin adjacent the first gate stack and a second source/drain region in the semiconductor fin adjacent the second gate stack, a first layer of a first dielectric material on the first gate stack and a second layer of the first dielectric material on the second gate stack, a first source/drain contact on the first source/drain region and adjacent the first gate stack, a first layer of a second dielectric material on a top surface of the first source/drain contact, and a second source/drain contact on the second source/drain region and adjacent the second gate stack, wherein the top surface of the second source/drain contact is free of the second dielectric material.

20 Claims, 22 Drawing Sheets

(51) Int. Cl.
  *H01L 29/08*    (2006.01)
  *H01L 29/66*    (2006.01)
(52) U.S. Cl.
  CPC .... *H01L 21/76897* (2013.01); *H01L 29/0847* (2013.01); *H01L 29/66795* (2013.01)
(58) Field of Classification Search
  CPC ......... H01L 21/76831; H01L 21/76883; H01L 21/823481; H01L 23/535; H01L 21/845; H01L 27/0924; H01L 27/10826; H01L 27/10879; H01L 27/1211; H01L 2029/7858; H01L 2924/13067; H01L 29/66818; H01L 29/7856; H01L 21/76877; H01L 21/76897; H01L 21/76816; H01L 21/76849; H01L 21/823456
  See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1* | 1/2017 | Ho .................. H01L 29/665 |
| 9,576,814 B2 | 2/2017 | Wu et al. |
| 9,831,183 B2 | 11/2017 | Lin et al. |
| 9,859,386 B2 | 1/2018 | Ho et al. |
| 2018/0122919 A1* | 5/2018 | Park .................. H01L 29/66545 |
| 2020/0066856 A1* | 2/2020 | Song .................. H01L 23/485 |
| 2020/0373196 A1* | 11/2020 | Li .................. H01L 21/845 |

* cited by examiner

FINFET CONTACTS AND METHOD FORMING SAME

BACKGROUND

In the recent development of transistor manufacturing technology, metal are used for forming contact plugs and metal gates. Contact plugs are used for connecting to the source and drain regions and the gates of transistors. The source/drain contact plugs are typically connected to source/drain silicide regions, which are formed by depositing a metal layer, and then performing an anneal to react the metal layer with the silicon in the source/drain regions. The gate contact plugs are used for connecting to the metal gates.

The formation of metal gates may include forming dummy gate stacks, removing the dummy gate stacks to form openings, filling a metallic material into the openings, and performing a planarization to remove excess metallic material in order to form the metal gates. The metal gates are then recessed to form recesses, and dielectric hard masks are filled into the recesses. When the gate contact plugs are formed, the hard masks are removed, so that the gate contact plugs may contact the metal gates.

Source/drain contact plugs are also formed to electrically couple to the source/drain regions. The formation of the source/drain contact plugs include etching Inter-Layer Dielectric (ILD) to form contact openings, and forming source/drain silicide regions and contact plugs in the contact openings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
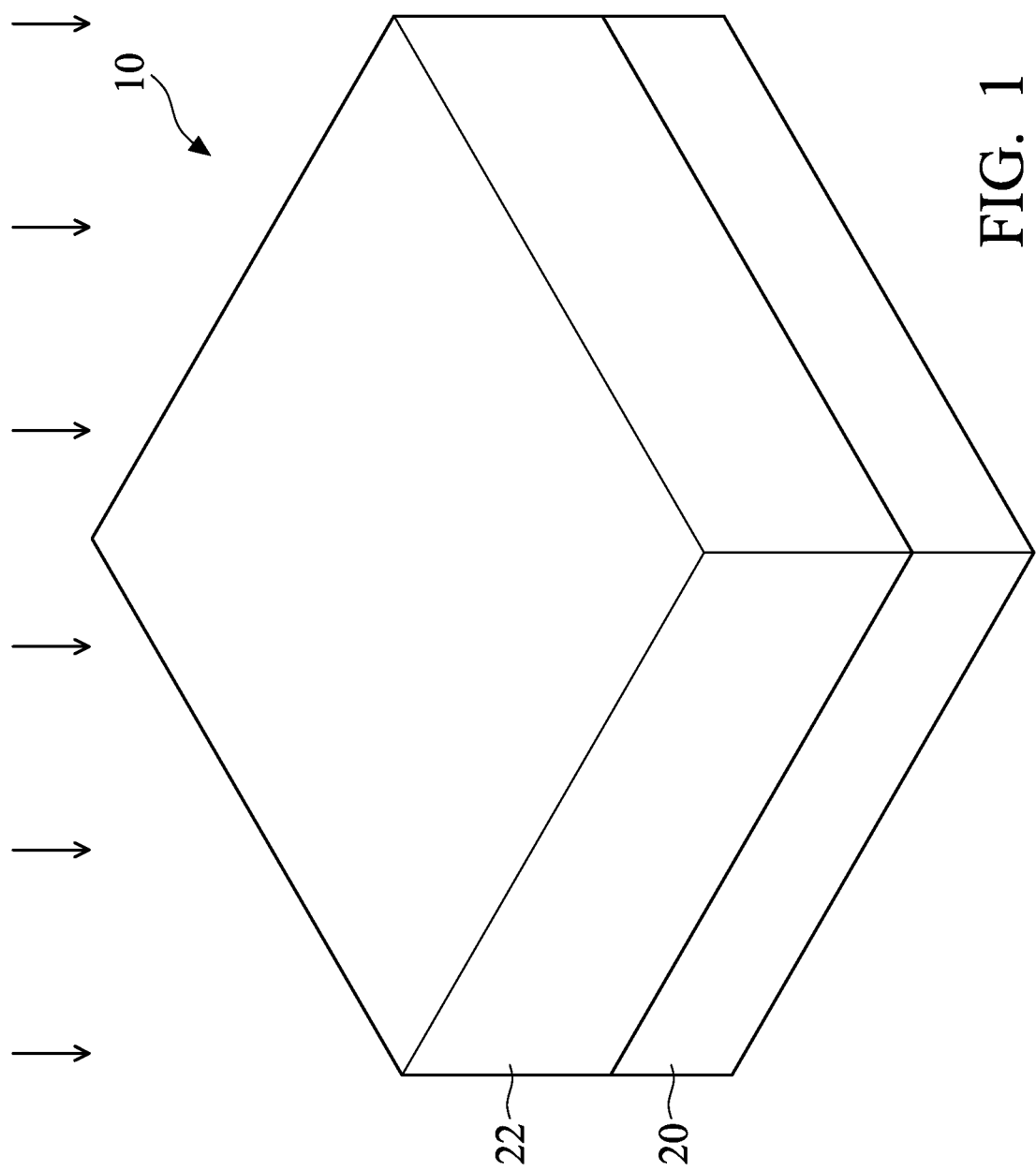
FIGS. 1-6 illustrate perspective views of intermediate stages in the formation of source/drain contact plugs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with source/drain contact plugs and the methods of forming the same are provided, in accordance with some embodiments. The intermediate stages of forming the source/drain contact plugs are illustrated in accordance with some embodiments. Some variations of some embodiments are discussed. In some embodiments, a recess and openings are formed in a dielectric material to form self-aligned contacts. The recess and openings are partially filled with conductive material (rather than, e.g., being overfilled), which allows for the self-aligned contacts to be formed using fewer planarization steps. The formation of the self-aligned contacts using fewer planarization steps allows for a thicker layer of the dielectric material to remain, which can improve process flexibility and improve yield. Throughout the various views and illustrative embodiments, like reference numbers are used to designate like elements. In some illustrated embodiments, the formation of Fin Field-Effect Transistors (FinFETs) is used as an example to explain the concept of the present disclosure. Planar transistors may also adopt the concept of the present disclosure.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. In accordance with some embodiments of the present disclosure, well region 22 is an n-type well region formed through implanting an n-type impurity, which may be phosphorus, arsenic, antimony, or the like, into substrate 20. In accordance with other embodiments of the present disclosure, well region 22 is a p-type well region formed through implanting a p-type impurity, which may be boron, indium, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
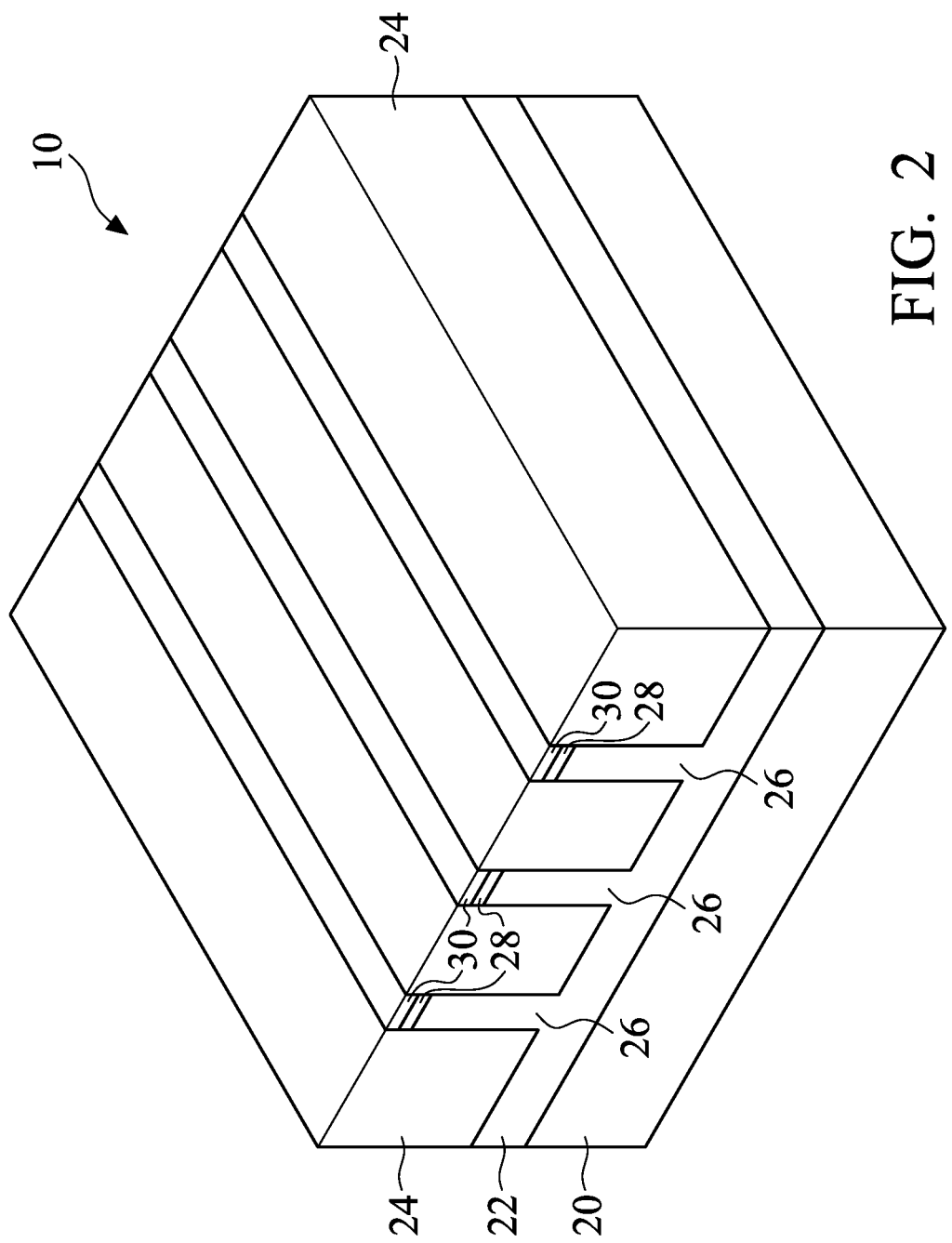

Referring to FIG. 2, isolation regions 24 are formed to extend from a top surface of substrate 20 into substrate 20. Isolation regions 24 are alternatively referred to as Shallow Trench Isolation (STI) regions hereinafter. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. The CMP process may use a slurry including an abrasive material such as Ce(OH)$_x$, CeO$_2$, SiO$_2$, TiO$_2$, Al$_2$O$_3$, ZrO$_2$, MnO, the like, or a combination thereof. The size of the abrasive material may be between about 1 nm and about 150 nm, in some embodiments. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
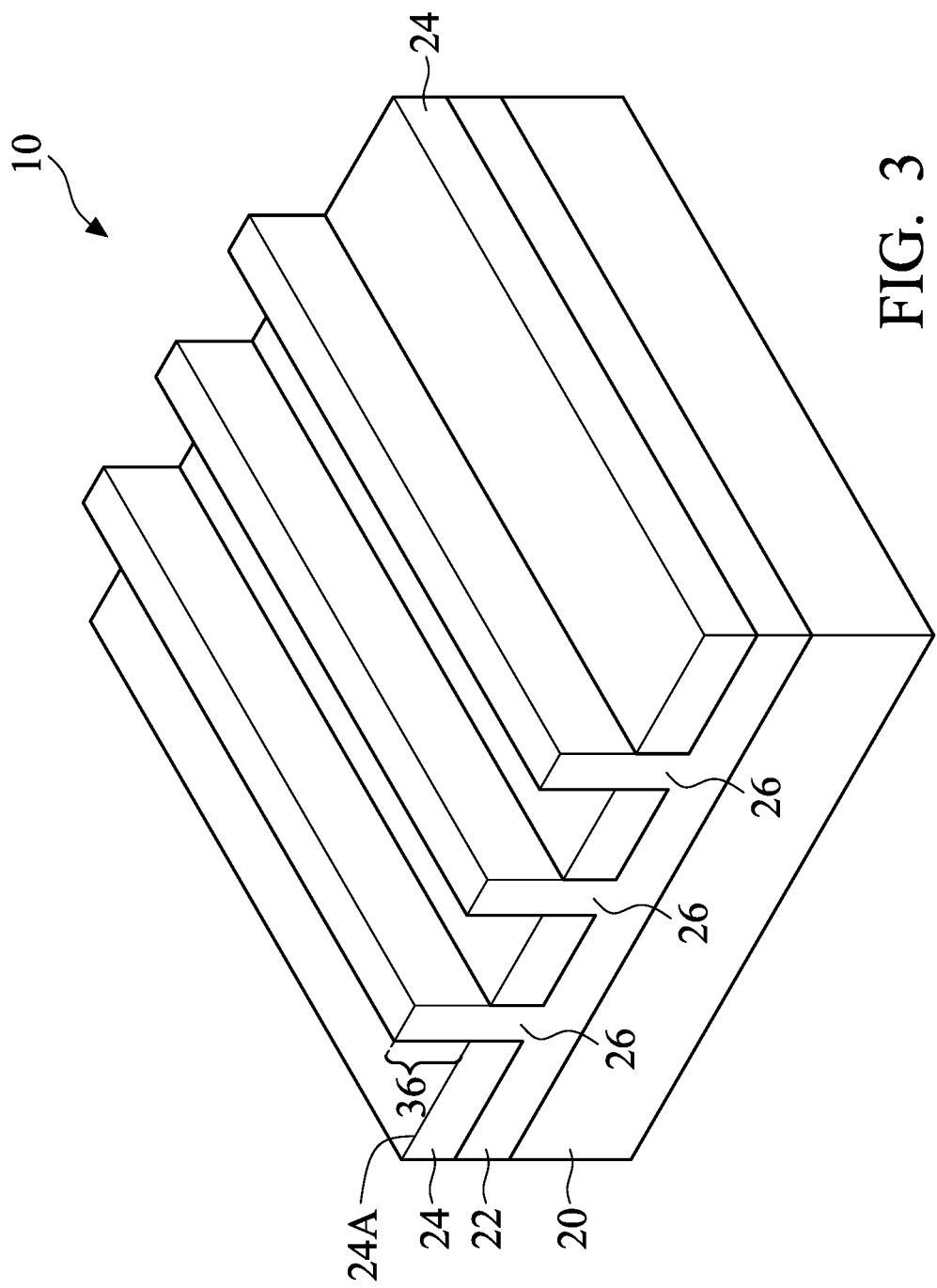

Referring to FIG. 3, STI regions 24 are recessed, so that the top portions of semiconductor strips 26 protrude higher than the top surfaces 24A of the remaining portions of STI regions 24 to form protruding fins 36. The etching may be performed using a dry etching process, wherein NF$_3$ and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
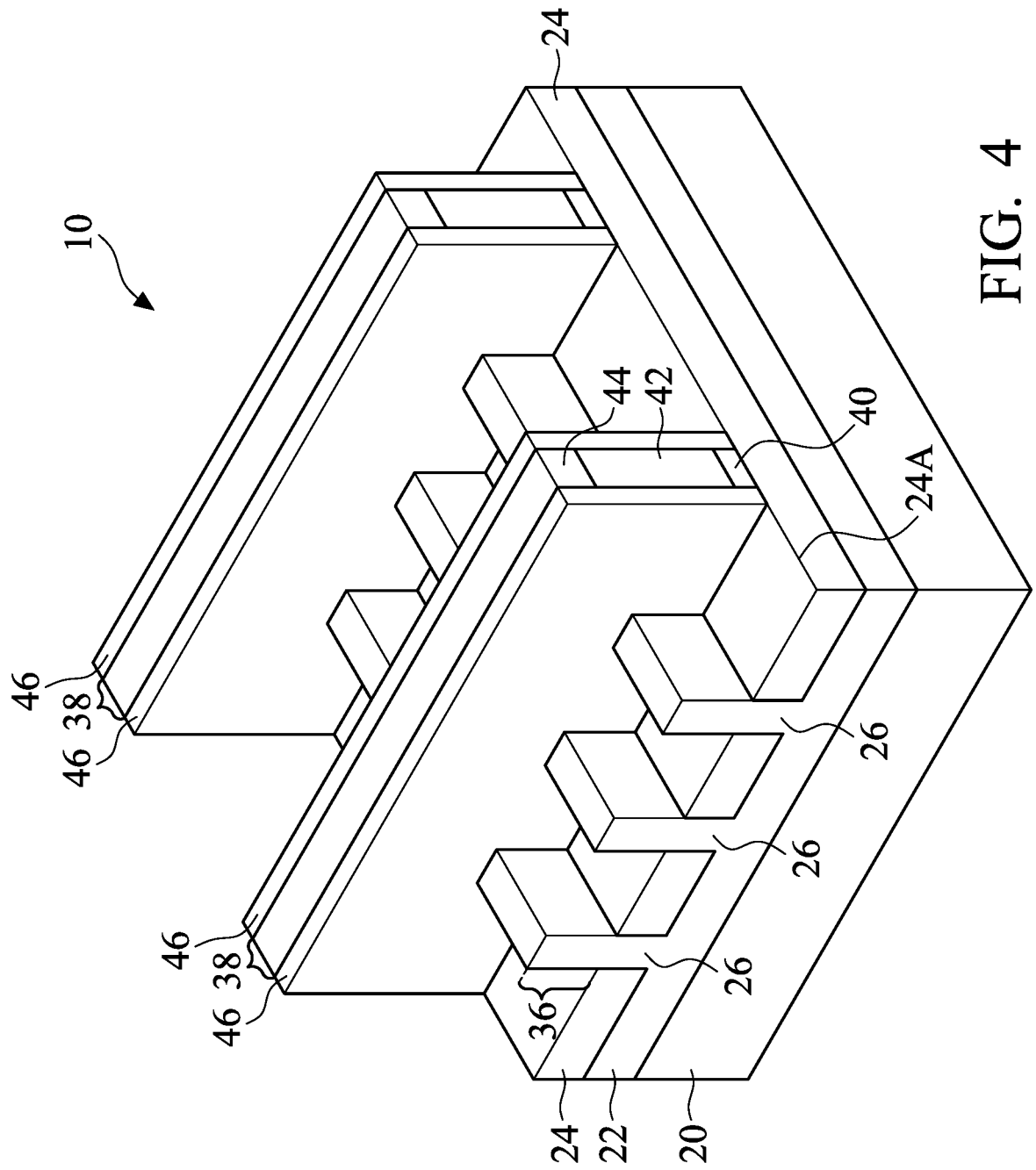

Referring to FIG. 4, dummy gate stacks 38 are formed to extend on the top surfaces and the sidewalls of (protruding) fins 36. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
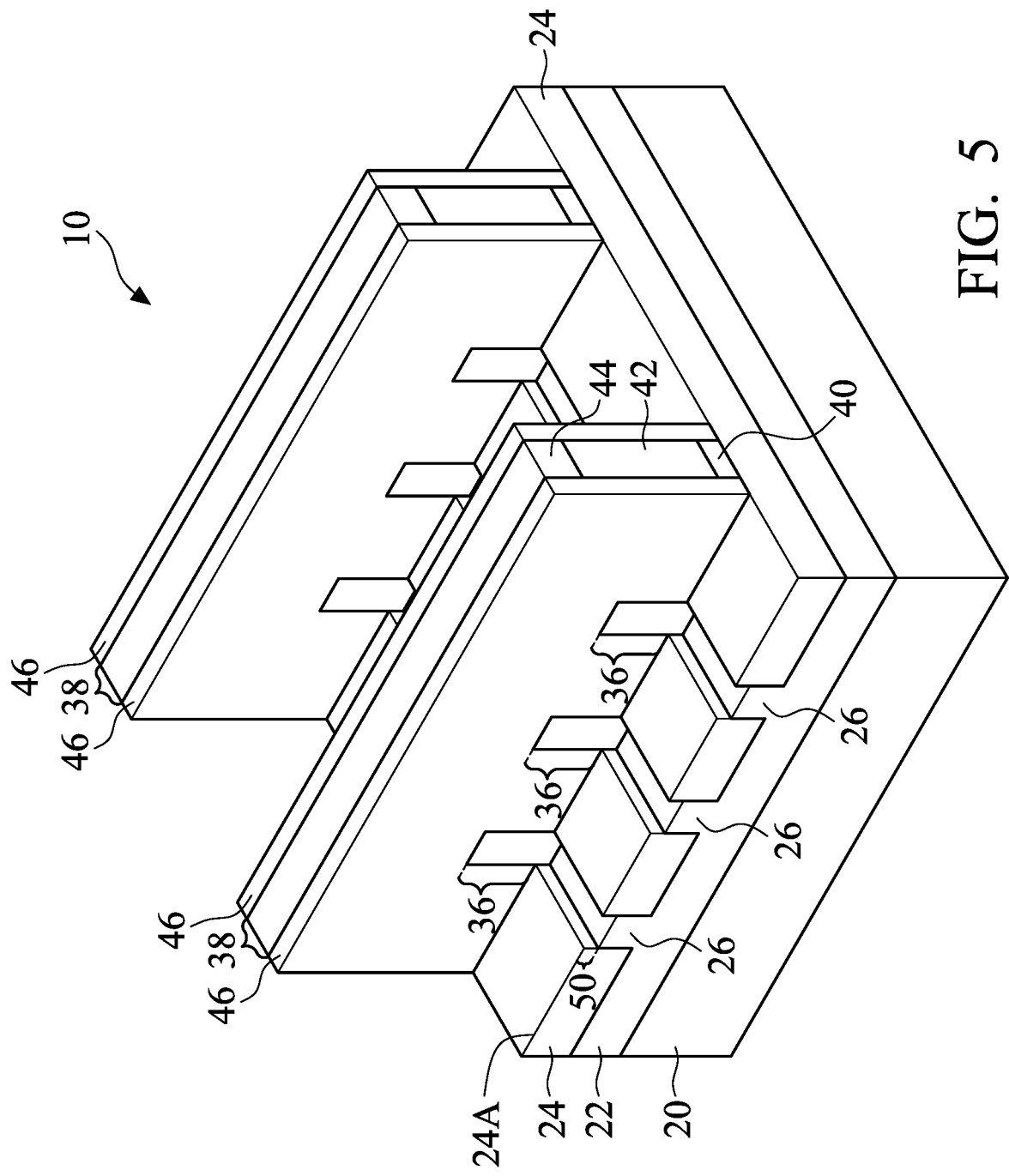

An etching process is then performed to etch the portions of protruding fins 36 that are not covered by dummy gate stacks 38 and gate spacers 46, resulting in the structure shown in FIG. 5. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
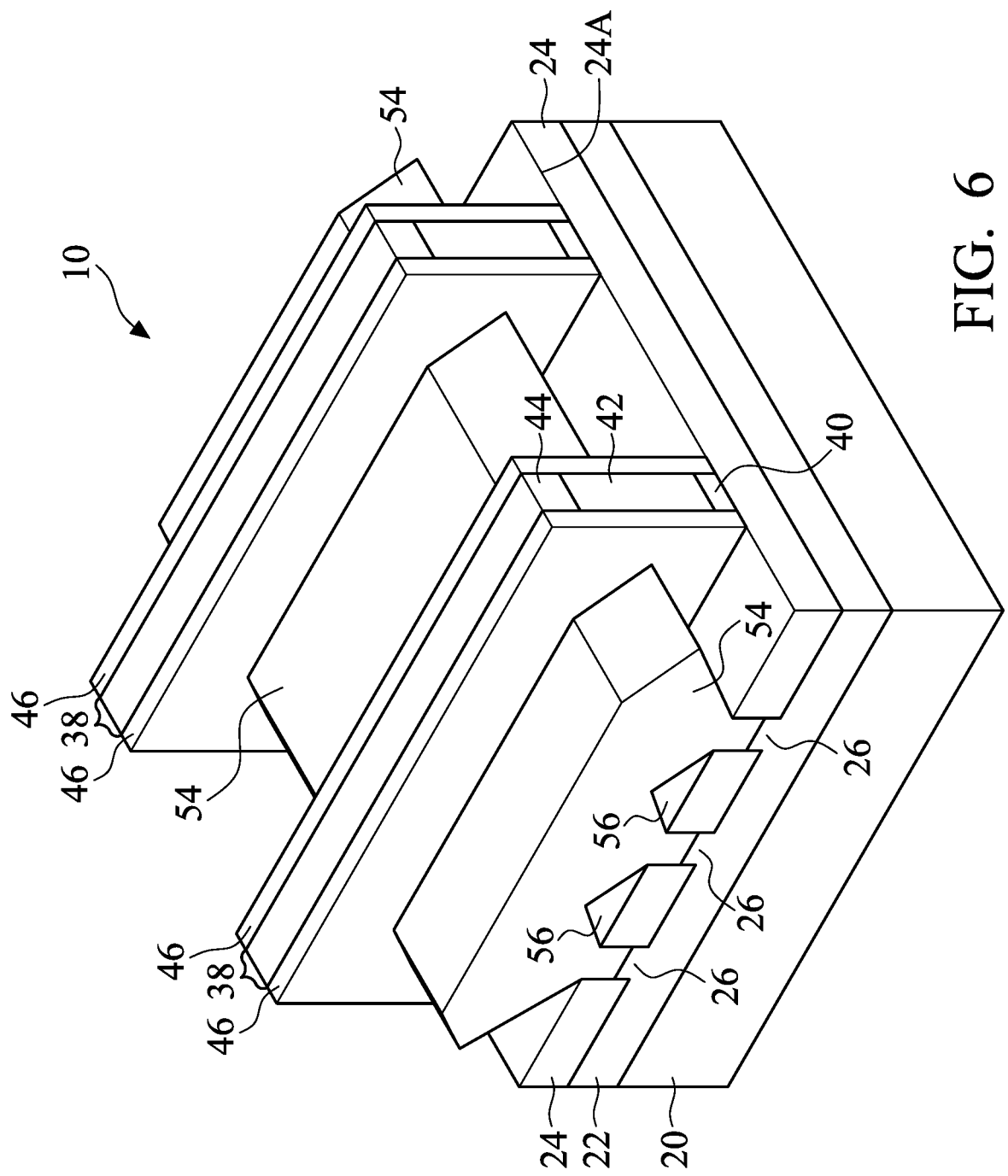

Next, epitaxy regions (source/drain regions) 54 are formed by selectively growing (through epitaxy) a semiconductor material in recesses 50, resulting in the structure in FIG. 6. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) or silicon boron (SiB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, multi-layers thereof, or the like. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become substantially planar, which is achieved by further growing on the epitaxy regions 54 as shown in FIG. 6.

After the epitaxy process, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
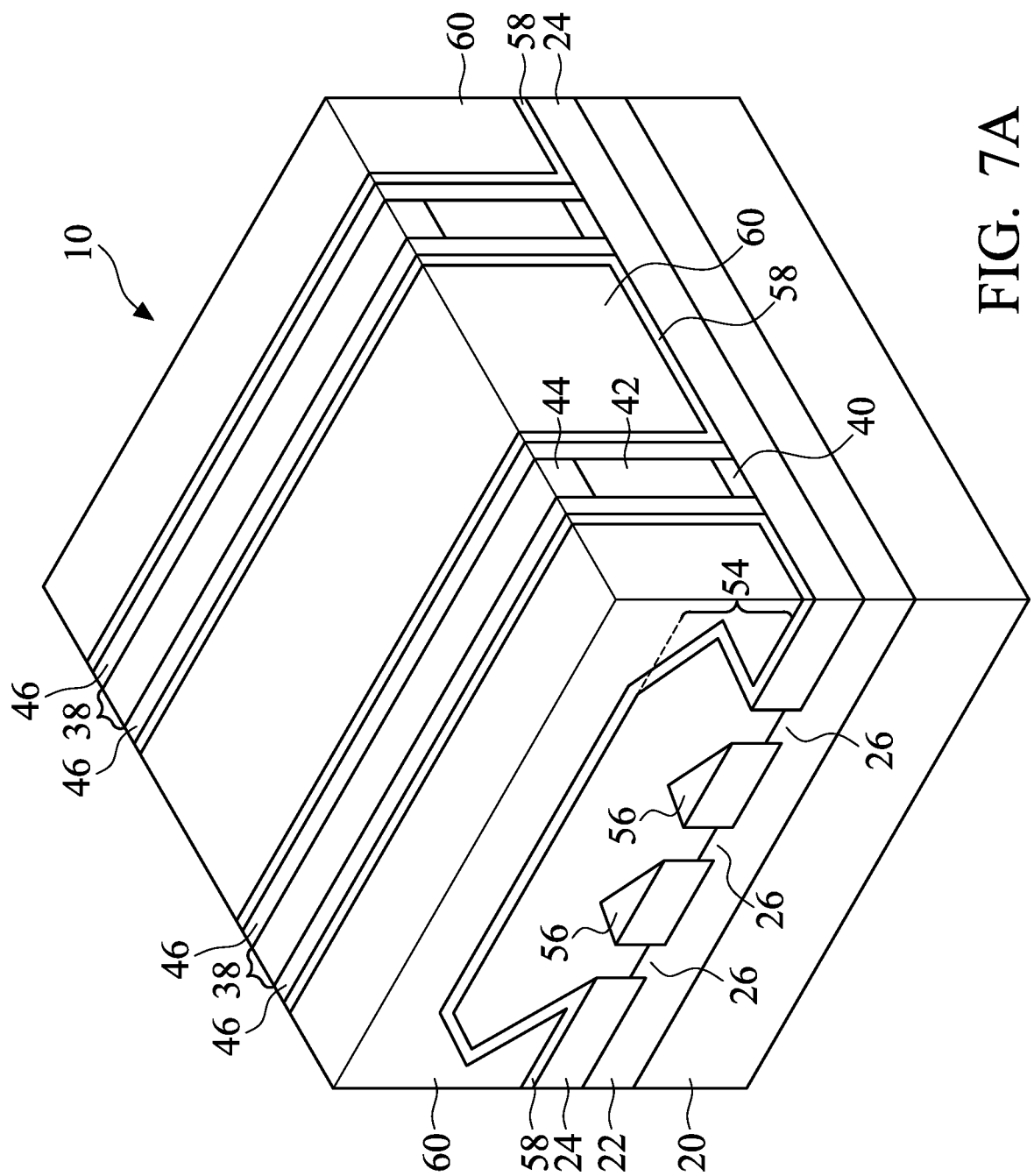
FIGS. 7A-B illustrate perspective views and cross-sectional views of intermediate stages in the formation of source/drain contact plugs in accordance with some embodiments.

FIG. 7A illustrates a perspective view of the structure after the formation of a Contact Etch Stop Layer (CESL) 58 and a first Inter-Layer Dielectric (ILD) 60. CESL 58 may be formed of silicon oxide, silicon nitride, silicon carbo-nitride, or the like, and may be formed using CVD, ALD, or the like. First ILD 60 may include a dielectric material formed using, for example, FCVD, spin-on coating, CVD, or another deposition method. First ILD 60 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of first ILD 60, dummy gate stacks 38, and gate spacers 46 with each other.

Figure 7B:
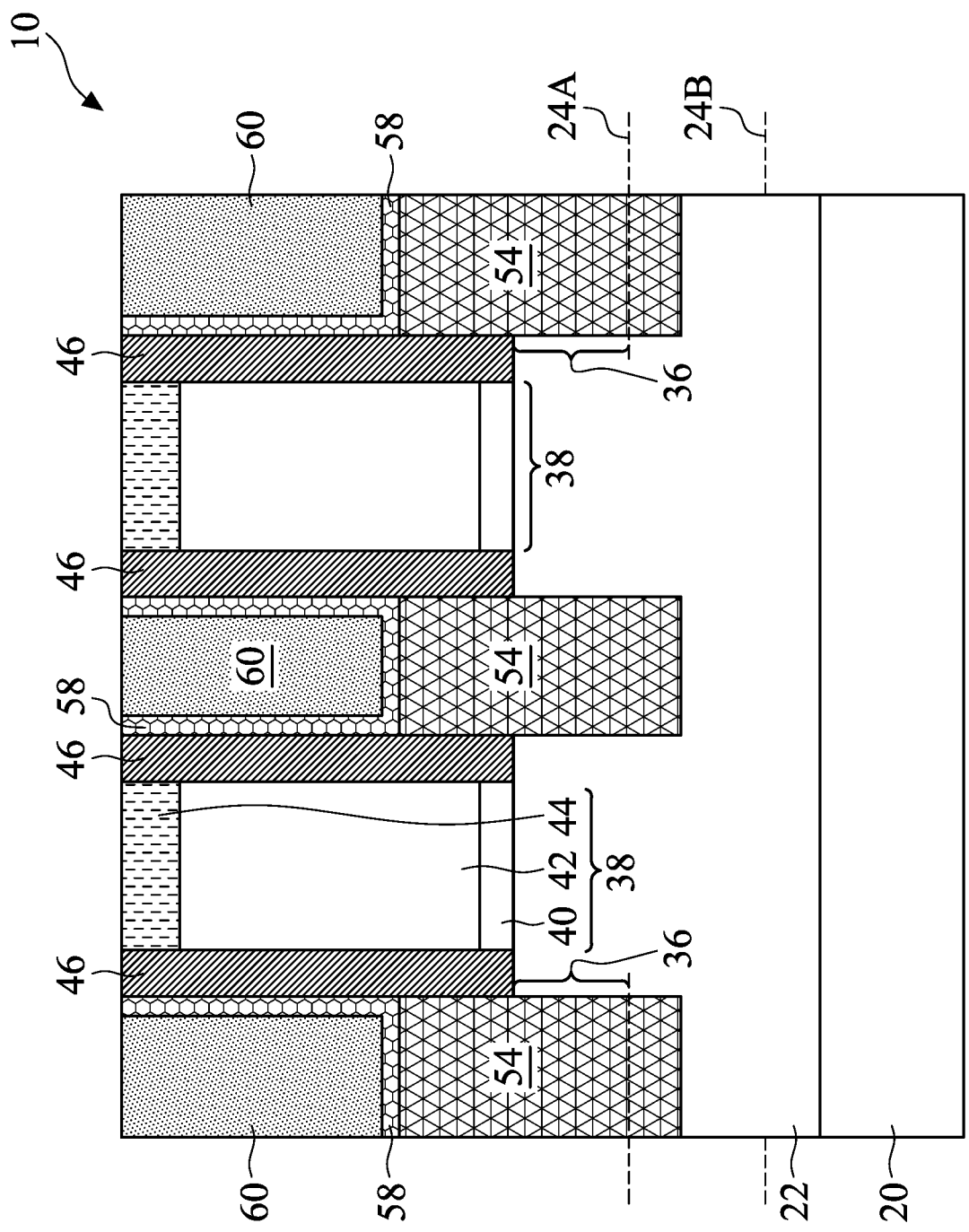
Figure 8:
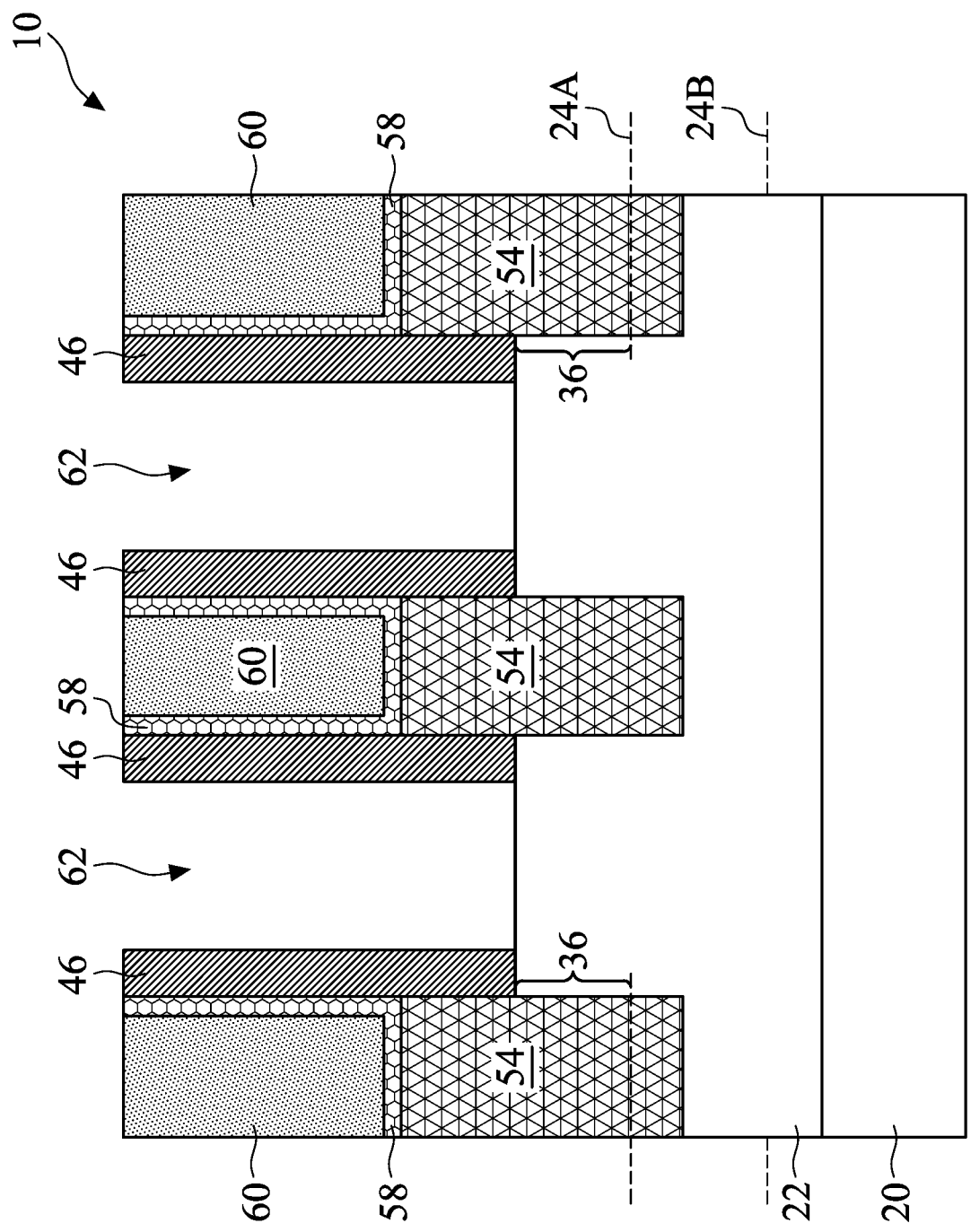
FIG. 8 illustrates a cross-sectional view of an intermediate stage in the formation of source/drain contact plugs in accordance with some embodiments.

FIG. 7B illustrates the reference cross-section 7B-7B in FIG. 7A, in which dummy gate stacks 38 are illustrated. Next, the dummy gate stacks 38 including hard mask layers 44, dummy gate electrodes 42 and dummy gate dielectrics 40 are etched, forming trenches 62 between gate spacers 46, as shown in FIG. 8. The top surfaces and the sidewalls of protruding fins 36 are exposed to trenches 62.

Figure 9A:
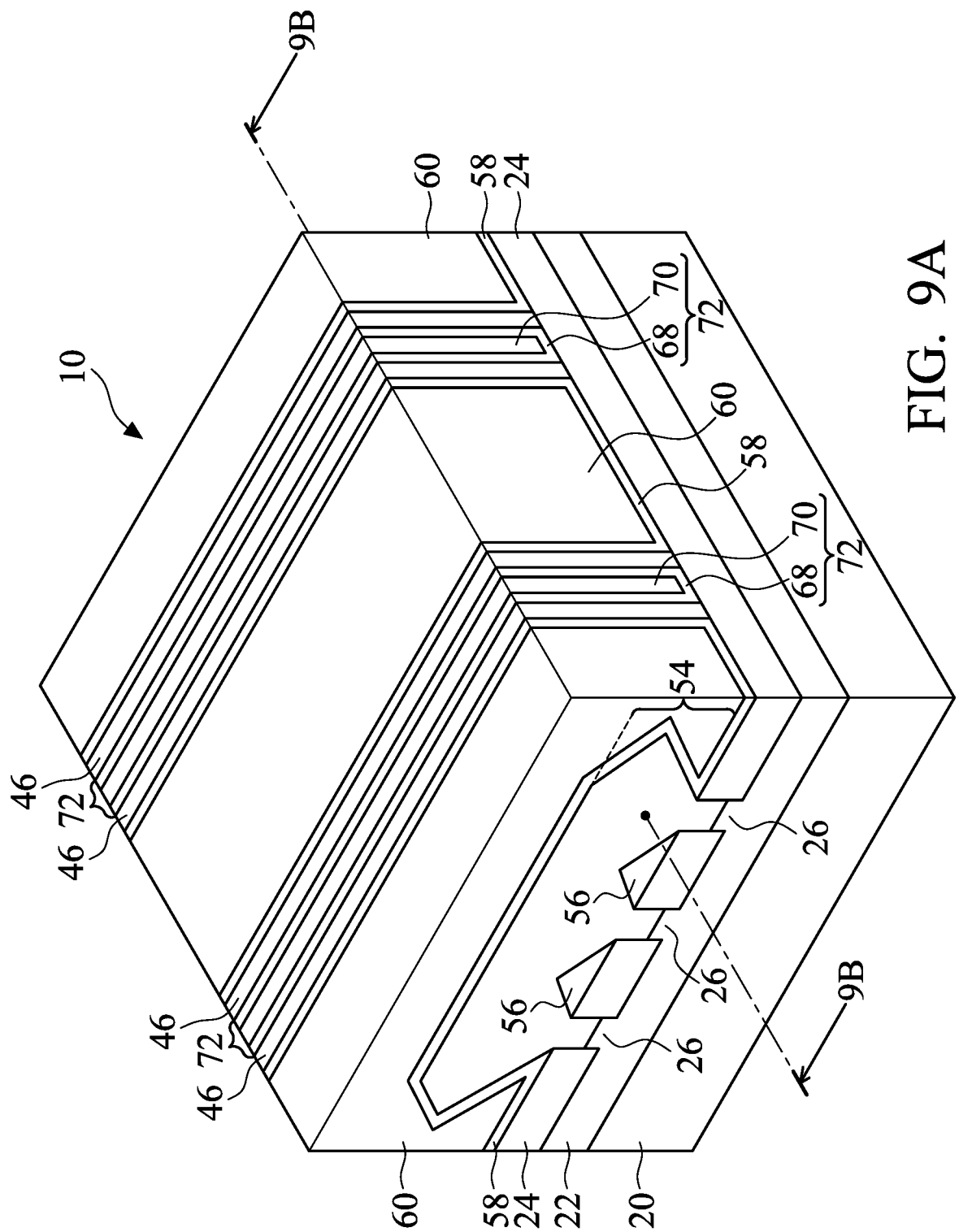
FIGS. 9A-B illustrate perspective views and cross-sectional views of intermediate stages in the formation of source/drain contact plugs in accordance with some embodiments.
Figure 9B:
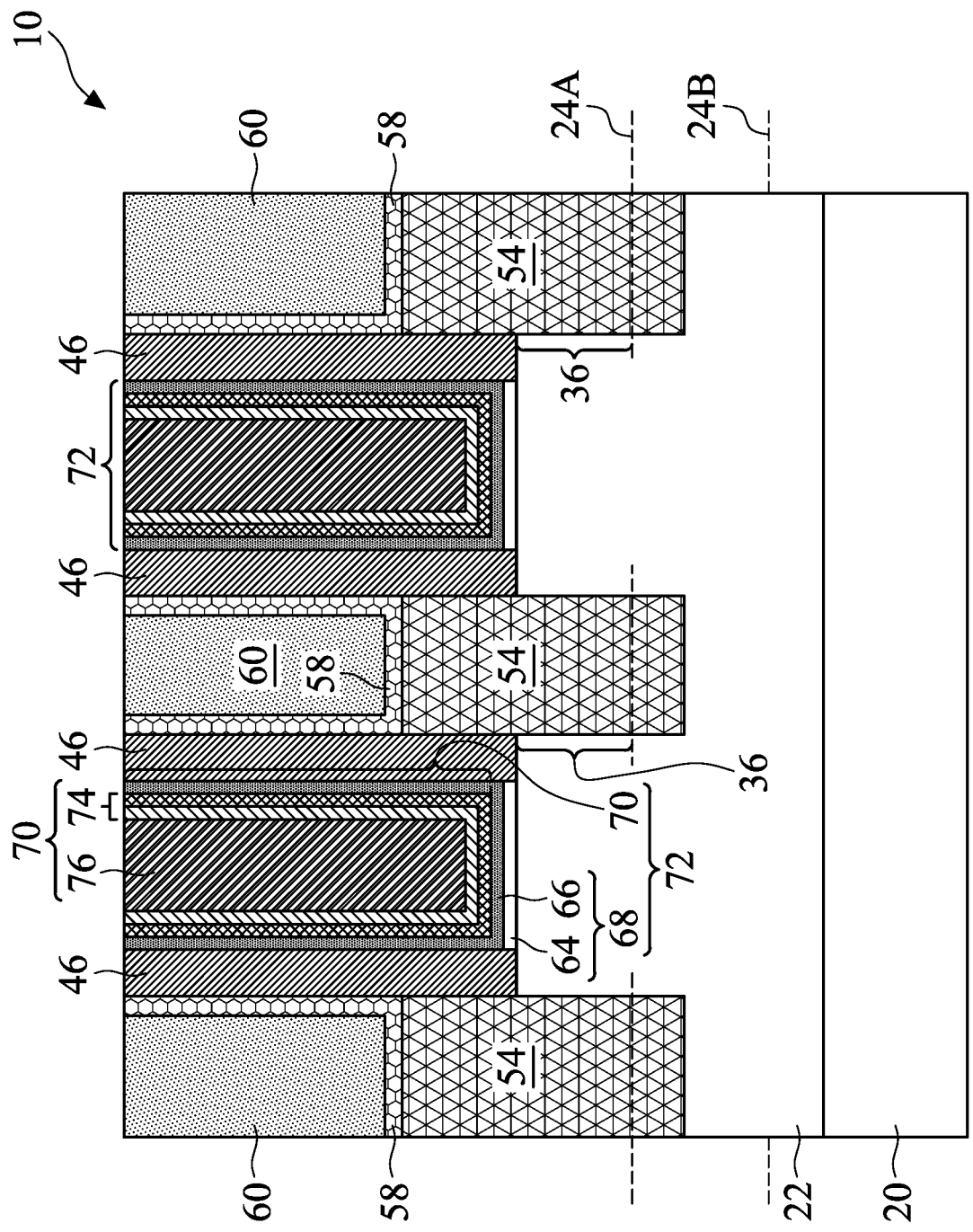

Next, as shown in FIGS. 9A and 9B, replacement gate stacks 72 are formed in trenches 62 (FIG. 8). FIG. 9B illustrates the reference cross-section 9B-9B in FIG. 9A. Replacement gate stacks 72 include gate dielectrics 68 and the corresponding gate electrodes 70.

In accordance with some embodiments of the present disclosure, a gate dielectric 68 includes Interfacial Layer (IL) 64 as its lower part. IL 64 is formed on the exposed surfaces of protruding fins 36. IL 64 may include an oxide layer such as a silicon oxide layer, which is formed through the thermal oxidation of protruding fins 36, a chemical oxidation process, or a deposition process. Gate dielectric 68 may also include high-k dielectric layer 66 formed over IL 64. High-k dielectric layer 66 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. High-k dielectric layer 66 is overlying, and may contact, IL 64. High-k dielectric layer 66 is formed as a conformal layer, and extends on the sidewalls of protruding fins 36 and the top surface and the sidewalls of gate spacers 46. In accordance with some embodiments of the present disclosure, high-k dielectric layer 66 is formed using ALD, CVD, PECVD, Molecular-Beam Deposition (MBD), or the like.

Further referring to FIG. 9B, gate electrode 70 is formed on gate dielectric 68. Gate electrode 70 may include a plurality of metal-containing layers 74, which may be formed as conformal layers, and filling-metal regions 76 filling the rest of the trenches unfilled by the plurality of metal-containing layers 74. Metal-containing layers 74 may include a barrier layer, a work-function layer over the barrier layer, and one or a plurality of metal capping layers over the work-function layer. In some embodiments, an optional capping layer (not shown) is formed over gate stacks 72, gate spacers 46, and first ILD 60. The capping layer may be formed of a suitable material such as silicon nitride, silicon carbide, silicon oxynitride, or silicon carbo-nitride, the like, or a combination thereof.

Figure 10:
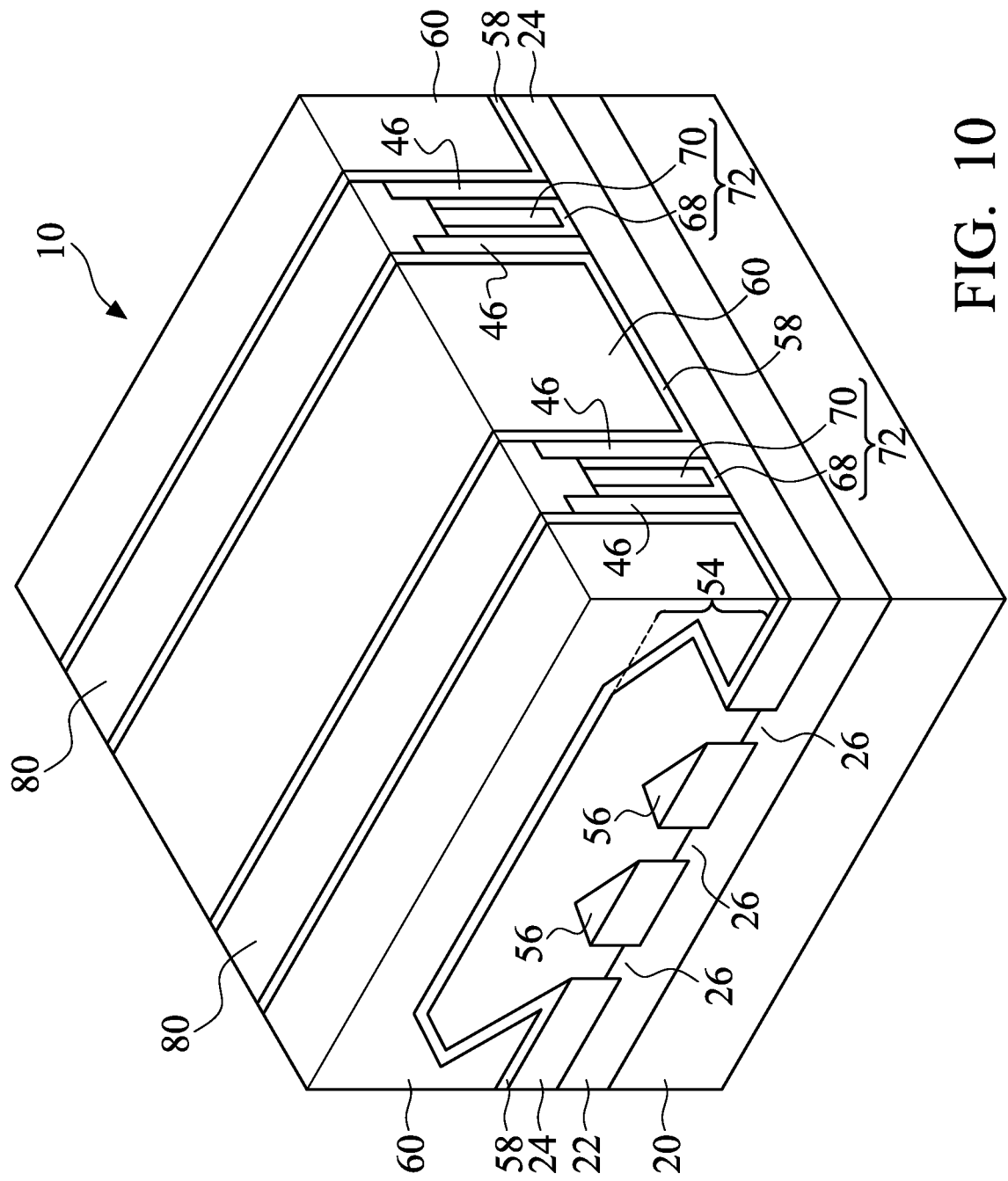
FIGS. 10-11 illustrate perspective views of intermediate stages in the formation of source/drain contact plugs in accordance with some embodiments.

FIG. 10 illustrates the formation of first Self-Aligned Contact Dielectric (SACD) 80, in accordance with some embodiments. First SACD 80 is formed over gate stacks 72 and gate spacers 46, and portions of first SACD 80 may be used as a hard mask. SACD 80 allows for the formation of self-aligned contacts 118A within first pitch region 81A (see FIG. 20). For example, SACD 80 can provide protection for the gate stacks 72 and gate spacers 46 during subsequent etching of openings 83A for contacts 118A (see FIG. 20) to the epitaxy regions 54. Due to the presence of first SACD 80, small process variations in the etching of openings 83A are less likely to form an electrical short between a contact 118A and a gate stack 72. In this manner, contacts 118A are "self-aligned" contacts.

The formation of first SACD 80 may include performing an etching process to form recesses in gate stacks 72, filling the recesses with a dielectric material, and then performing a planarization process such as a CMP process or a mechanical grinding process to remove excess portions of the dielectric material. Gate spacers 46 may also be recessed in the etching process. In some embodiments, first SACD 80 may have top surfaces about level with the top surfaces of gate spacers 46, or first SACD 80 may have top surfaces that protrude higher than the top surfaces of gate spacers 46. The sizes and positions of portions of first SACD 80 are self-aligned to gate stacks 72 and gate spacers 46. The material of first SACD 80 may be selected from, and is not limited to, titanium nitride, hafnium oxide, zirconium nitride, aluminum oxide, aluminum oxy-nitride, silicon, silicon oxide, silicon nitride, silicon oxy-nitride, silicon carbide, silicon carbo-nitride, silicon oxy-carbide, silicon oxy-carbo-nitride, other nitrides, other oxides, other dielectric materials, the like, or a combination thereof. First SACD 80 may be formed using a suitable deposition process, such as CVD, ALD, FCVD, PECVD, MOCVD, spin-on coating, or another deposition method.

Figure 11:
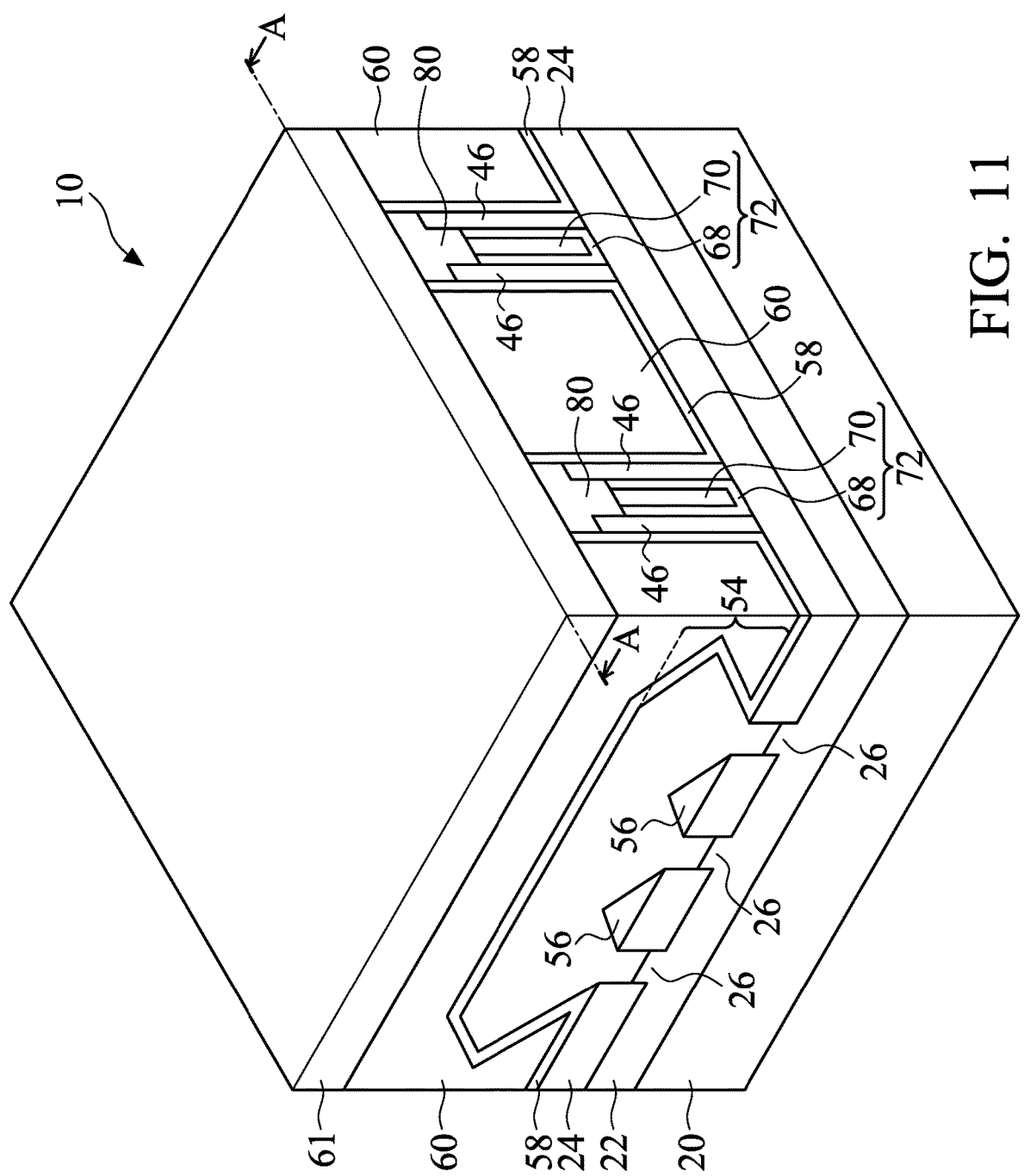

FIG. 11 illustrates the formation of second ILD 61, in accordance with some embodiments. Second ILD 61 is formed over gate stacks 72, gate spacers 46, and first ILD 60. Second ILD 61 may be formed over a capping layer, if present. Second ILD 61 may be formed from a dielectric material similar to first ILD 60, a different dielectric material having a different composition, or a dielectric material formed using a different process. Second ILD 61 may include a dielectric material formed using, for example, FCVD, spin-on coating, CVD, or another deposition method.

FIGS. 12-20 illustrate the formation of contacts 118 (see contacts 118A-B in FIG. 20) in accordance with some embodiments. FIGS. 12-20 illustrate the reference cross-section "A-A," shown in FIG. 11. Some details of the structures are not shown in FIGS. 12-20. For example, in FIGS. 12-20, the source/drain regions 54, source/drain silicide regions, semiconductor fins 36, STI regions 24, and the like, are not shown. Some of the details that are not shown in FIGS. 12-20 may be found in reference to previous Figures, such as FIG. 9B or FIG. 11.

Figure 12:
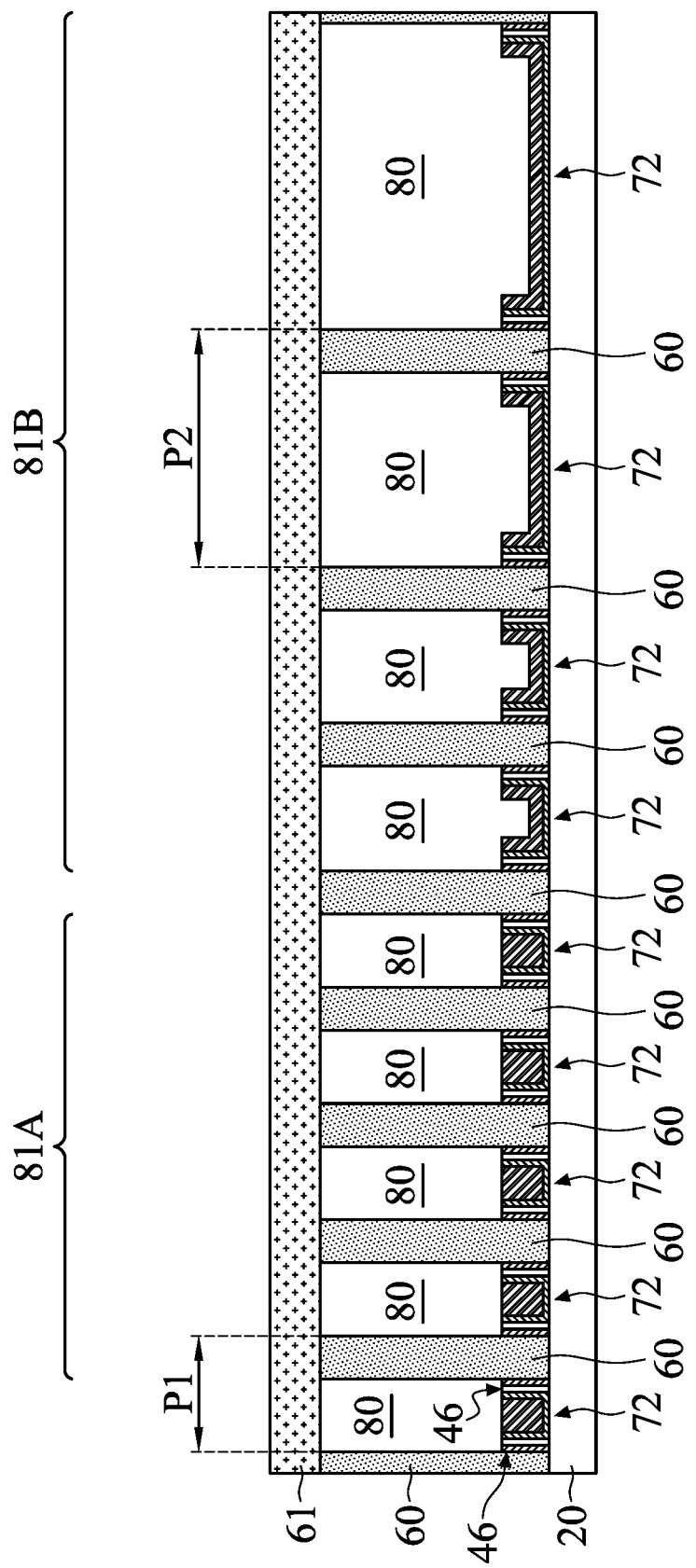
FIGS. 12-20 illustrate cross-sectional views of intermediate stages in the formation of source/drain contact plugs in accordance with some embodiments.

FIG. 12 illustrates a structure that is similar to that shown in FIG. 11, aside from showing multiple gate stacks 72 separated by regions of first ILD 60. The example structure shown in FIG. 12 includes gate stacks 72 having different pitches. For reference, a first pitch region 81A includes gate stacks 72 having a relatively smaller pitch (an example smaller pitch P1 is shown), and a second pitch region 81B includes gate stacks 72 having a relatively larger pitch (an example larger pitch P2 is shown). In some embodiments, the pitch (e.g., P1 or P2) of gate stacks 72 may be between about 50 Å and about 5000 Å. In some embodiments, the ratio of P1:P2 may be between about 1:1 and about 1:100. In some cases, regions having a smaller pitch (e.g., pitch P1) may make the formation of source/drain contacts in those regions (see contacts 118A in FIG. 20) more sensitive to process variations. Thus, different contacts may be formed in regions having different pitches (e.g., different pitches P1 and P2) in order to reduce the chance of defects in either region. For example, self-aligned contacts (e.g., contacts 118A in FIG. 20) may be formed in a region having a smaller pitch (e.g. pitch P1), and non-self-aligned contacts (e.g., contacts 118B in FIG. 20) may be formed in a region having a larger pitch (e.g. pitch P2). The processes described herein allow for the formation of contacts in regions having different pitches with reduced chance of processing defects and using a reduced number of processing steps.

Figure 13:
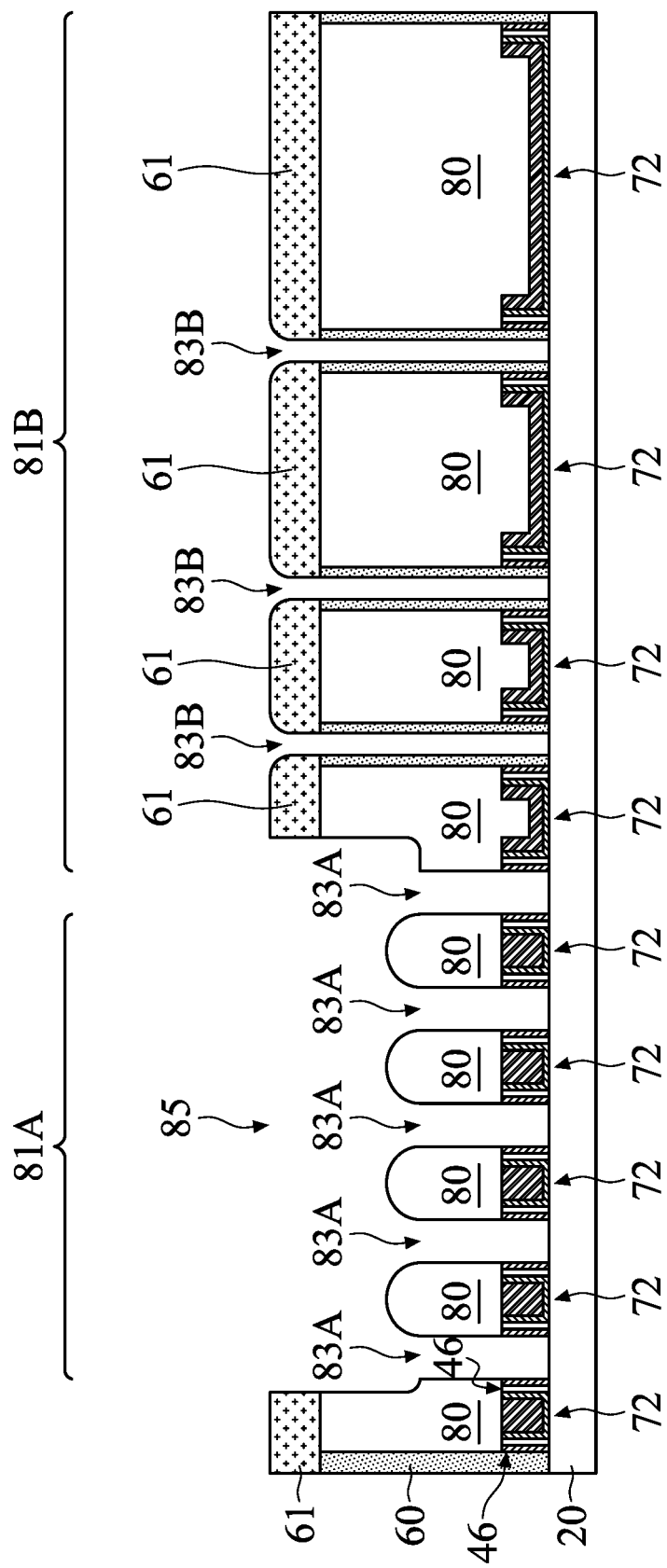

FIG. 13 illustrates the formation of openings 83A and 83B through first ILD 60 and second ILD 61. Openings 83A are formed in first pitch region 81A, and openings 83B are formed in second pitch region 81B. The formation of openings 83A and 83B includes etching first ILD 60 and second ILD 61 to expose the underlying portions of CESL 58, and then etching the exposed portions of CESL 58 to expose source/drain epitaxy regions 54 (not shown in FIGS. 12-20). In some embodiments, a recess 85 may be formed in first SACD 80 in the first pitch region 81A. Recess 85 may be formed such that openings 83A are self-aligned to form contacts 118A (see FIG. 20). For example, the etching process used for forming self-aligned openings 83A may remove some upper portions of first SACD 80 but not completely etch through first SACD 80 in first pitch region 81A. Thus, portions of first SACD 80 remain over gate stacks 72 in first pitch region 81A, allowing for the contacts 118A to be self-aligned contacts. For example, the etching process may etch the first SACD 80 a depth between about 50 Å and about 1000 Å. Within recess 85, portions of first SACD 80 within the first pitch region 81A may have top surfaces that are closer to the substrate than portions of first SACD 80 within second pitch region 81B. Due to the larger pitch(es) of second pitch region 81B, the use of a recess 85 to form self-aligned openings may not be necessary, and the openings 83B may be formed extending through the full thickness of first SACD 80 in second pitch region 81B, rather than first etching a recess (e.g., similar to recess 85) into first SACD 80 and then forming openings 83B within the recess. In some embodiments, openings 83A may be wider than openings 83B to allow for more complete filling of openings 83A by a conductive layer 82 (se FIG. 13). In some embodiments, openings 83A may have a width between about 10 Å and about 1000 Å, and openings 83B may have a width between about 10 Å and about 800 Å.

Recess 85, openings 83A, and openings 83B may be formed by using acceptable photolithography and etching techniques. For example, a photoresist structure or hard mask may be formed over second ILD 61 and patterned, and that pattern used to etch first ILD 60, second ILD 61, or first SACD 80. In some embodiments, recess 85 is etched in one etching process, and openings 83A and/or openings 83B are etched in one or more different processes. In other embodiments, recess 85 and openings 83A are etched in one etching process, and openings 83B are etched in a different etching process. In some embodiments, recess 85, openings 83A, and openings 83B are formed by one or more anisotropic dry etch processes. For example, an etching process may include a dry etch process using a process gas that selectively etches ILDs 60 and 61 at a greater rate than first SACD 80. In some embodiments, the process gas may include one gas or a mixture of gases such as $C_4F_6$, $CF_4$, $C_5F$, $NF_3$, $O_2$, $N_2$, Ar, Cl, the like, or a combination thereof. In some embodiments, the process gas may be supplied to the processing chamber at a total gas flow of from about 50 sccm to about 2000 sccm. In some embodiments, the pressure of the etch chamber during the etch process is from about 10 mTorr to about 200 mTorr.

Still referring to FIG. 13, once the source/drain epitaxy regions 54 have been exposed through openings 83A and openings 83B, an optional silicide contact (not separately illustrated) may be formed on the epitaxy regions 54. The silicide contact may comprise titanium, nickel, cobalt, or erbium in order to reduce the Schottky barrier height of the contact. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the silicide contact may be between about 5 nm and about 50 nm.

Figure 14:
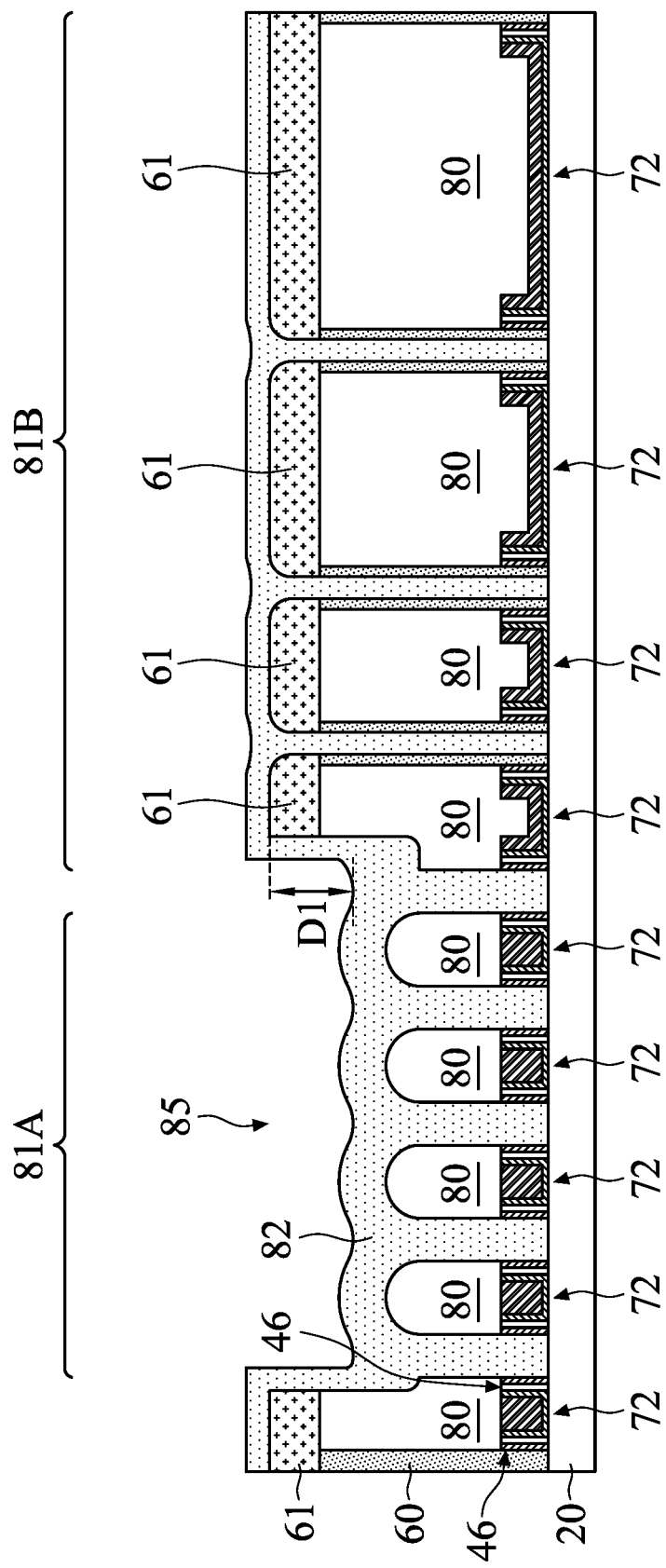

FIG. 14 illustrates the formation of a conductive layer 82 in openings 83A and 83B, in accordance with some embodiments. The conductive layer 82 makes physical connection with the silicide contact (when present) or the epitaxy regions 54. Conductive layer 82 is formed such that conductive layer 82 extends over first SACD 80 in recess 85 of first pitch region 81A and over second ILD 61 of second pitch region 81B. An amount of conductive layer 82 is deposited such that recess 85 is incompletely filled by the material of conductive layer 82. For example, top surfaces of conductive layer 82 within recess 85 may be lower than top surfaces of second ILD 61 by a distance D1 that is between about 1 Å and about 500 Å. The deposition of the conductive layer 82 may be stopped when openings 83A and 83B have been completely filled by conductive layer 82 but before the recess 85 has been completely filled by conductive layer 82. The depth of recess 85 and/or a larger width of openings 83A may allow both openings 83A and 83B to be filled before recess 85 is filled. In some embodiments, conductive layer 82 in first pitch region 81A may be deposited to a height above substrate 20 that is between about 100 Å and about 1000 Å. In some embodiments, conductive layer 82 in second pitch region 81B may be deposited to a height above substrate 20 that is between about 200 Å and about 1500 Å, which is greater than the height of conductive layer 82 in first pitch region 81A.

In some embodiments, conductive layer 82 includes a barrier layer (not separately shown). The barrier layer helps to block diffusion of the subsequently formed conductive layer 82 into adjacent dielectric materials such as ILDs 60 or 61. The barrier layer may be made of titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, polybenzoxazole (PBO) the like, or a combination thereof. The barrier layer may be formed by CVD, PVD, PECVD, ALD, SOD, the like, or a combination thereof. In some embodiments, the barrier layer is omitted.

Conductive layer 82 includes a conductive material which is formed within the openings 83A and openings 83B and over the barrier layer (if present). The conductive material may include a suitable conductive material such as cobalt, W, Al, Cu, AlCu, W, TaC, TaCN, TaSiN, Mn, Zr, TiN, Ta, TaN, Ni, Ti, TiAlN, Ru, Mo, or WN, although any suitable material, such as aluminum, copper, alloys of these, combinations of these, or the like, and may be deposited using a deposition process such as sputtering, CVD, electroplating, electroless plating, or the like.

Figure 15:
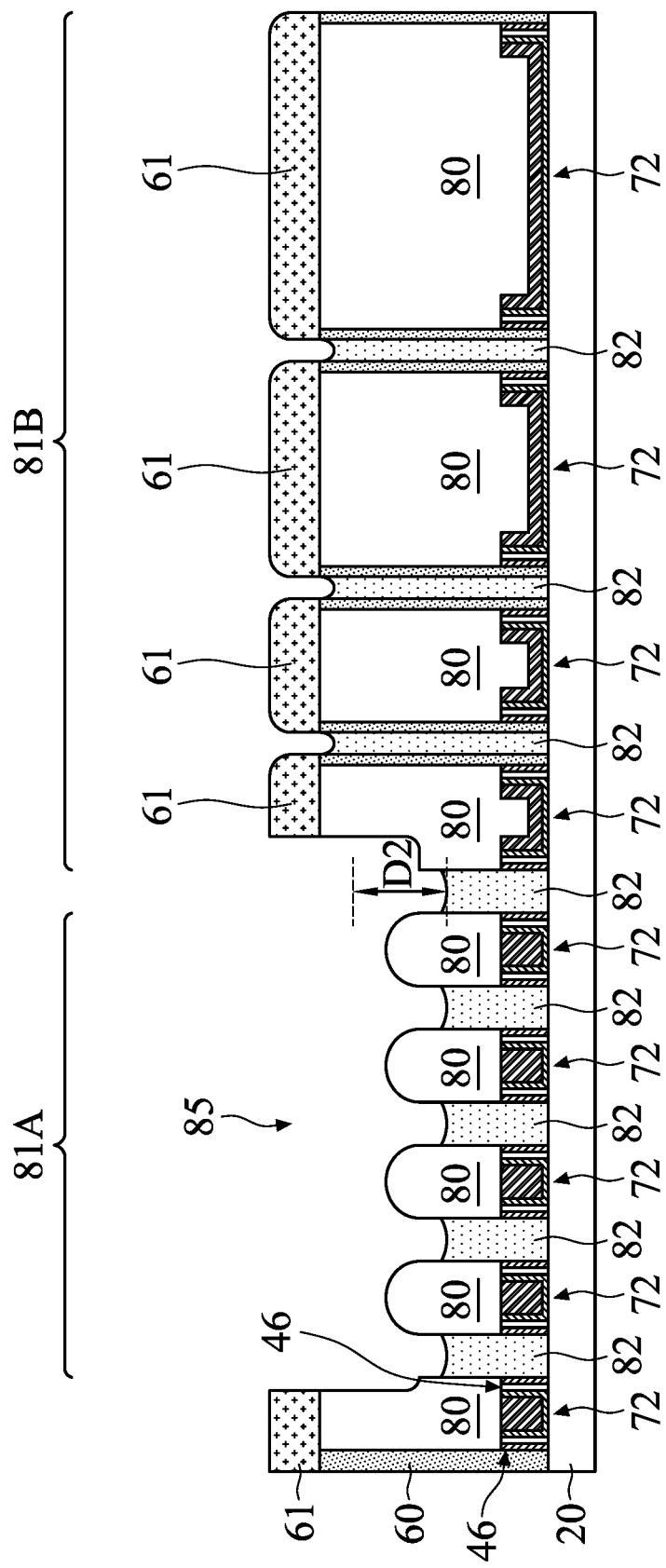

Turning to FIG. 15, conductive layer 82 is recessed, in accordance with some embodiments. Conductive layer 82 may be recessed to a level below a top surface of first SACD 80 in first pitch region 81A and below a top surface of second ILD 61 in second pitch region 81B. Conductive layer 82 may be recessed a distance D2 that is between about 50 Å and about 500 Å in some embodiments. In some embodiments, conductive layer 82 in first pitch region 81A may have top surfaces that are closer to the substrate than top surfaces of conductive layer 82 in second pitch region 81B. For example, conductive layer 82 in first pitch region 81A may have a height above the substrate 20 between about 50 Å and about 800 Å, and conductive layer 82 in second pitch region 81B may have a height above the substrate 20 between about 100 Å and about 1300 Å. However, any suitable distance may be utilized, and the conductive layer 82 may be recessed different distances in different regions of a structure. Conductive layer 82 may be recessed using a wet etching process, a dry etching process, or a combination thereof. In some embodiments, conductive layer 82 may be recessed using one or more etchants that are selective to the material of conductive layer 82 over the material of first SACD 80 and/or the material of second ILD 61.

In some cases, completely filling recess 85 with conductive layer 82 requires excess conductive layer 82 to be removed in a separate step (e.g. using a CMP process or other planarization process) before recessing in order to achieve uniform recessing in both first pitch region 81A and second pitch region 81B. For example, if recess 85 is completely filled by conductive layer 82, the thickness of conductive layer 82 above openings 83A in first pitch region 81A may be significantly greater than the thickness of conductive layer 82 extending above openings 83B in second pitch region 81B. This difference in thickness of conductive layer 82 may cause unacceptable differences in recessing between first pitch region 81A and second pitch region 81B if a CMP process is not first performed, for instance. In the embodiments shown in FIGS. 14-15, because recess 85 is only partially filled with conductive layer 82 instead of completely filled with conductive layer 82, the recessing of the conductive layer 82 may be performed without first removing excess conductive layer 82 (e.g., using a CMP process or other planarization process). By depositing conductive layer 82 such that recess 85 is incompletely filled, a difference in between a thickness of conductive layer 82 above openings 83A and a thickness of conductive layer 82 above openings 83B may be reduced, allowing for a more uniform recessing in first pitch region 81A and second pitch region 81B without first performing a planarization process. In this manner, by not first performing a planarization process, the number of processing steps for can be reduced. Additionally, reducing the total number of planarization processes performed during processing can allow for a larger height of first SACD 80 remaining over each gate stack 72 in the FinFET device (see FIG. 17).

Figure 16:
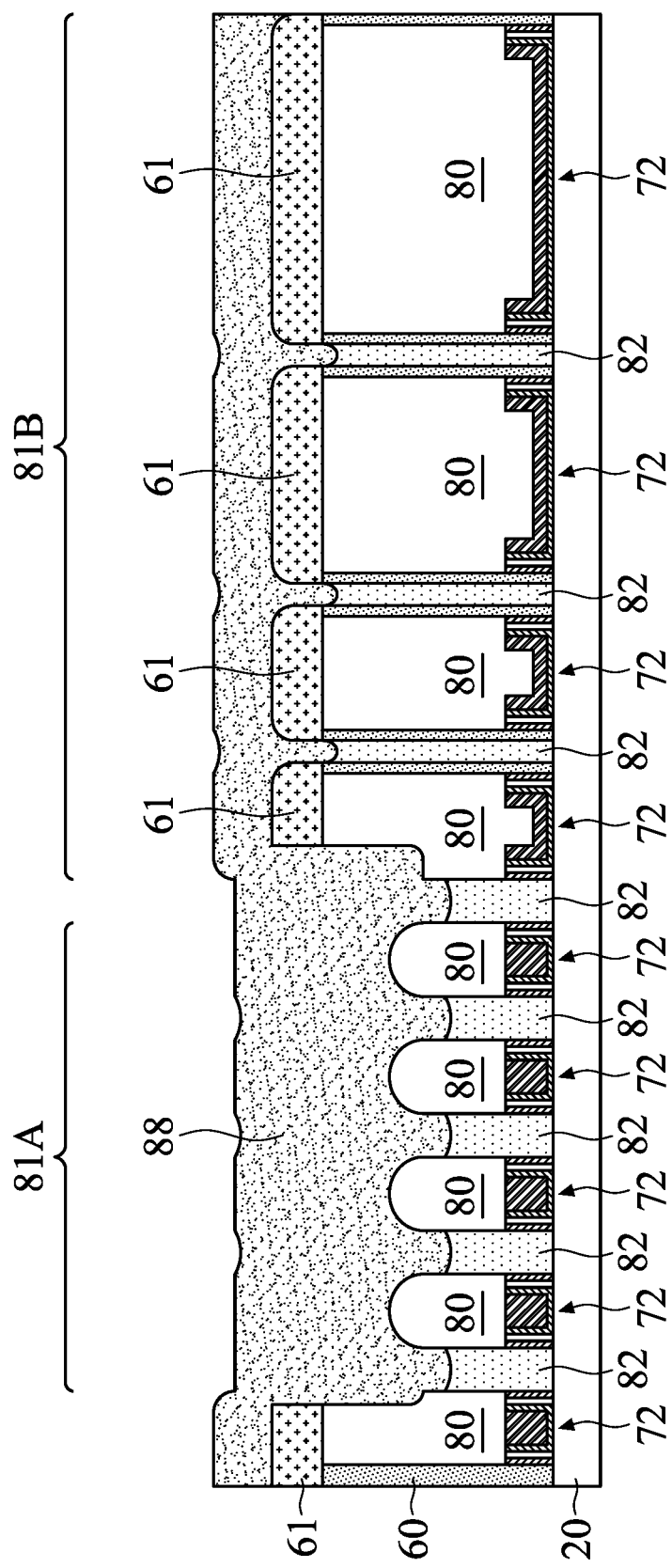

FIG. 16 illustrates the formation of a second Self-Aligned Contact Dielectric (SACD) 88, in accordance with some embodiments. The second Self-Aligned Contact Dielectric 88 allows for the formation of self-aligned contacts 118 within first pitch region 81A (see FIG. 20). For example, second SACD 88 can protect conductive layer 82 in first pitch region 81A during subsequent processing to reduce the chance of electrical shorts being formed between conductive material 116 of contacts 118A (see FIG. 20) and other conductive features. Second SACD 88 is formed over first SACD 80, conductive layer 82, and second ILD 61. For example, in first pitch region 81A, second SACD 88 is formed over first SACD 80 and conductive layer 82, and in second pitch region 81B, second SACD 88 is formed over second ILD 61 and conductive layer 82. Second SACD 88 may fill recess 85, in some embodiments. For example, a top surface of second SACD 88 in first pitch region 81A may be higher above substrate 20 than top surfaces of second ILD 61 in second pitch region 81B. The material of second SACD 88 may be selected from, and is not limited to, titanium nitride, halfnium oxide, zirconium nitride, aluminum oxide, aluminum oxy-nitride, silicon, silicon oxide, silicon nitride, silicon oxy-nitride, silicon carbide, silicon carbo-nitride, silicon oxy-carbide, silicon oxy-carbo-nitride, other nitrides, other oxides, other dielectric materials, the like, or a combination thereof. Second SACD 88 may be formed using a suitable deposition process, such as CVD, ALD, FCVD, PECVD, MOCVD, spin-on coating, or another deposition method. In some embodiments, the material of second SACD 88 is different than the material of first SACD 80, such that a subsequent etching process may be selective to the material of second SACD 88 over the material of first SACD 80.

Figure 17:
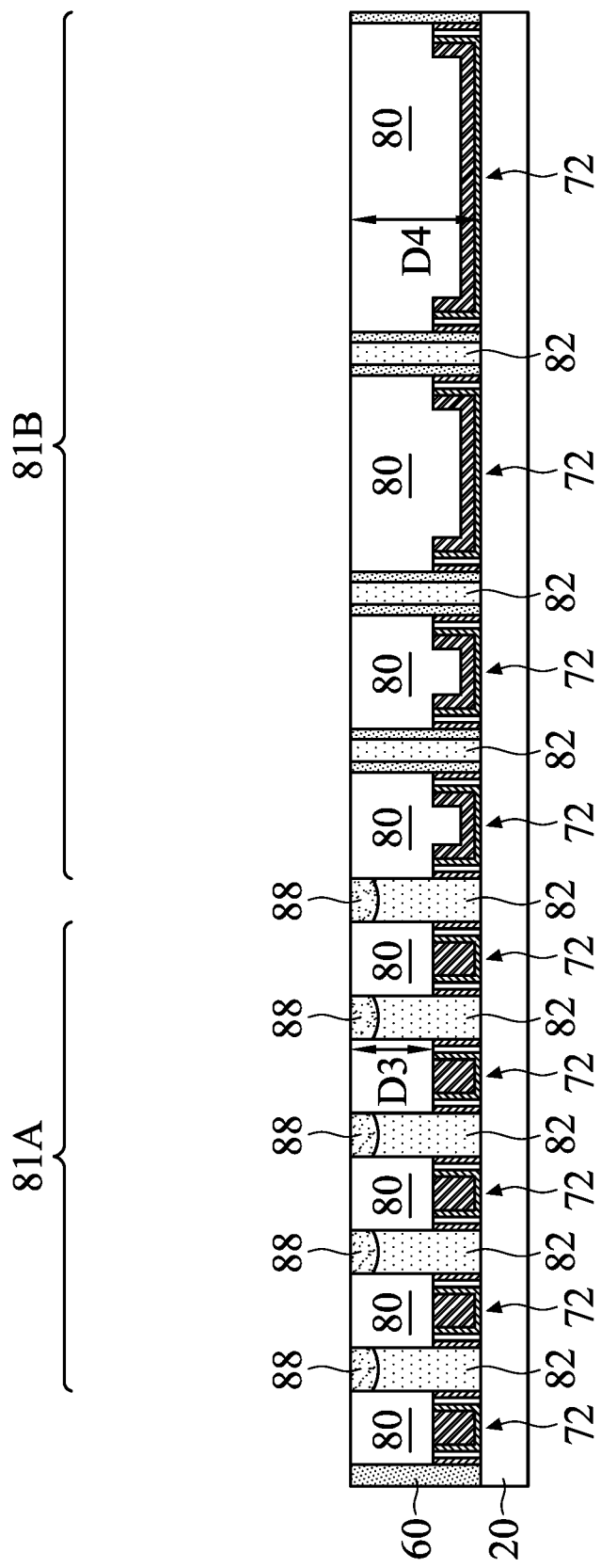

Turning to FIG. 17, a planarization process is performed on the second SACD 88 to planarize first SACD 80, second SACD 88, and conductive layer 82. The planarization may include one or more etching processes or grinding processes such as CMP processes. Due to the greater thickness of conductive layer 82 in second pitch region 81B (see FIG. 16), second SACD 88 is removed from over conductive layer 82 during the planarization process. Thus, in first pitch region 81A, second SACD 88 remains over conductive layer 82, and in second pitch region 81B, conductive layer 82 is free of second SACD 88. After the planarization process, the exposed top surfaces of first SACD 80, second SACD 88, conductive layer 82, and first ILD 60 are level.

Due to the recess 85 being incompletely filled by conductive layer 82 (see FIG. 14), fewer planarization processes are performed prior to planarization of second SACD 88, and thus the height of first SACD 80 above the gate stacks 72 may be larger than if more planarization processes were performed. In some embodiments, after performing the planarization process on second SACD 88, first SACD 80 has a height D3 above gate stacks 72 that is between about 50 Å and about 500 Å. In some embodiments, after performing the planarization on second SACD 88, a top surface of first SACD 80 is a distance D4 above substrate 20 that is between about 50 Å and about 800 Å. In some embodiments, after performing the planarization process, the second SACD 88 over the conductive layer 82 has a thickness between about 10 Å and about 300 Å. In some embodiments, after performing the planarization process, the conductive layer 82 in the first pitch region 81A has a height between about 10 Å and about 300 Å and the conductive layer 82 in the second pitch region 81B has a height between about 50 Å and about 500 Å.

In some cases, having a greater available thickness of first SACD 80 over gate stacks 72 can increase the process flexibility for forming FinFET devices. For example, the margin of over-planarizing or under-planarizing may be larger due to the larger thickness of first SACD 80, and thus yield may be improved. Additionally, the larger thickness of first SACD 80 may allow the planarization to be performed more thoroughly or more cleanly. Additionally, a larger thickness of first SACD 80 over gate stacks 72 can reduce the chance of shorts (e.g., contact-to-gate, gate-to-gate, or contact-to-contact shorts), and thus improve yield. By reducing the number of planarization processes performed, the cost of processing may also be reduced.

Figure 18:
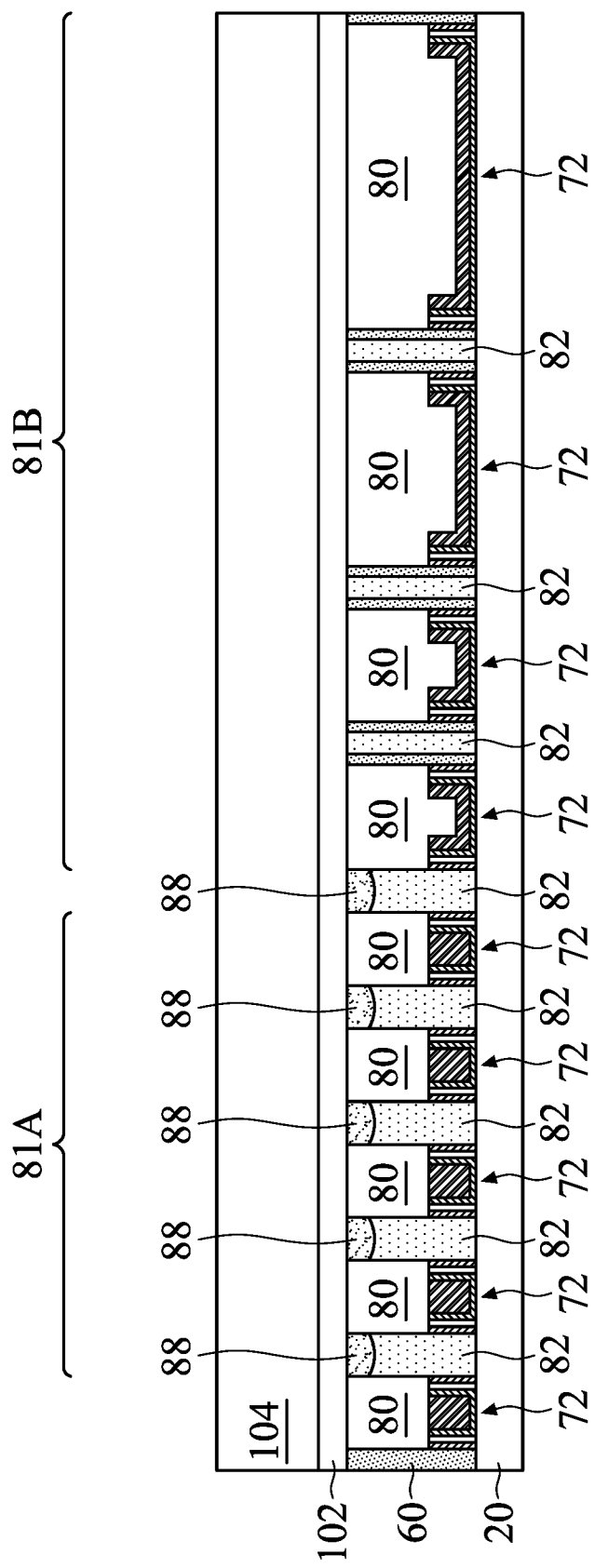

FIG. 18 illustrates the formation of etch stop layer 102 and hard mask 104, in accordance with some embodiments. Etch stop layer 102 and hard mask 104 are used for forming and preserving the patterns of source/drain contact openings 106 (see FIG. 19). Etch stop layer 102 may be formed of an oxide, a nitride, a carbide, an oxycarbide, the like, or a combination thereof. Etch stop layer 102 may be formed by a suitable deposition process such as CVD, PVD, ALD, or the like. Hard mask 104 may be formed of titanium nitride, boron nitride, oxide, nitride, the like, or a combination thereof. Hard mask 104 may be formed by a suitable deposition process such as CVD, PVD, ALD, spin-on coating, or the like.

Figure 19:
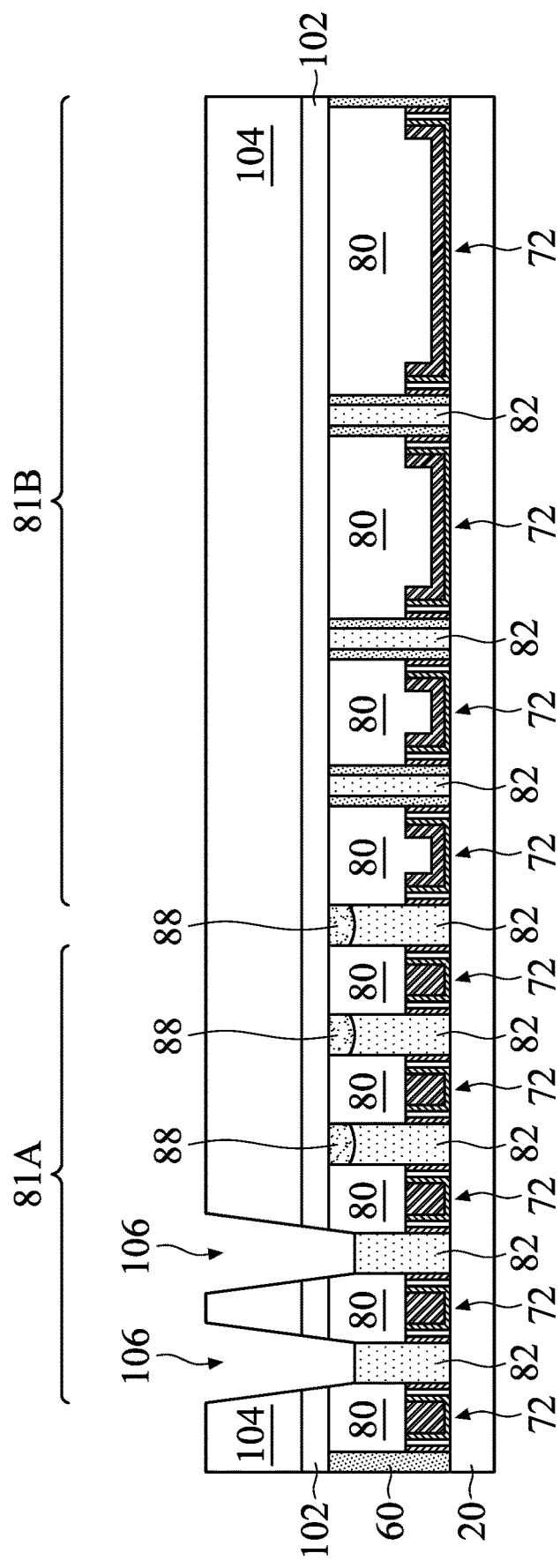

Turning to FIG. 19, source/drain contact openings 106 are formed, in accordance with some embodiments. Source/drain contact openings 106 are formed to expose contact plugs 82 in first pitch region 81A. Source/drain contact openings 106 may be formed using a suitable photolithography and etching process. For example, hard mask 104 may be patterned and then used as an etching mask to form source/drain contact openings 106. The source/drain contact openings 106 may be formed using a suitable etching process, such as a dry etching process. The etching process removes second SACD 88 over conductive layer 82 to expose conductive layer 82 where contacts 118A are to be formed (see FIG. 20). In some embodiments, the etching process is selective to the material of second SACD 88 over the material of first SACD 80.

Figure 20:
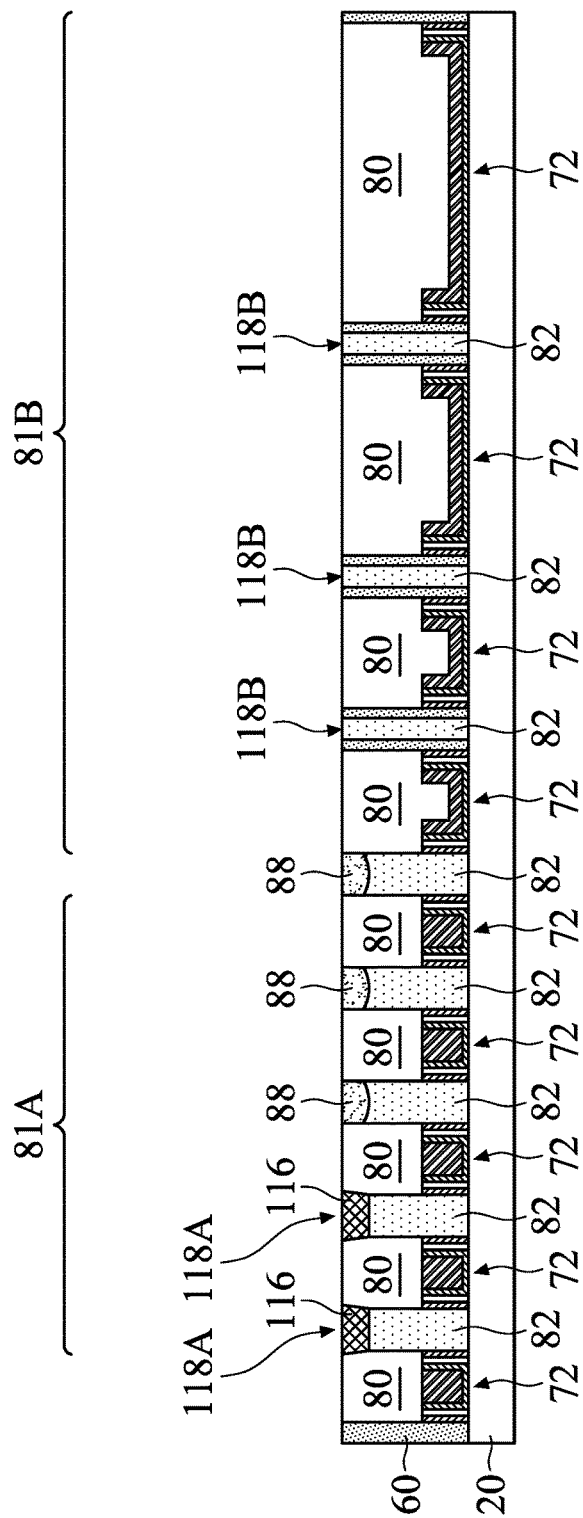

Turning to FIG. 20, contacts 118A and contacts 118B are formed, in accordance with some embodiments. Contacts 118A and contacts 118B provide electrical connection to epitaxy regions 54. Contacts 118A may be considered "self-aligned" contacts due to the presence of the first SACD 80 and/or second SACD 88. Contacts 118A may be formed by filling a conductive material 116 into openings 106 and performing a planarization process (e.g., a CMP process or a grinding process) to remove excess portions of the conductive material 116. The planarization process also exposes conductive layer 82 in second pitch region 81B, forming contacts 118B. After the planarization process, exposed surfaces of conductive material 116, conductive layer 82, first SACD 80, and second SACD 88 may be level. As shown in FIG. 20, contacts 118A in first pitch region 81A may include conductive material 116 disposed over conductive layer 82 and contacts 118B in second pitch region 81B may be free of conductive material 116. In accordance with some embodiments of the present disclosure, the conductive material 116 includes a diffusion barrier layer, which may be formed of titanium nitride, tantalum nitride, titanium, or tantalum, and a filling material such as copper, tungsten, cobalt, ruthenium, or the like. Conductive material 116 may be formed through a deposition process such as electrochemical plating, PVD, CVD, the like, or a combination thereof.

The embodiments of the present disclosure have some advantageous features. With the reduction of the feature sizes in integrated circuits, the sizes of source/drain contact plugs and gate contact plugs are reduced. It becomes harder to form the contact plugs with small sizes, for example, due to topology and limitations of the photolithography processes. In some cases, multiple self-aligned dielectrics are used to form self-aligned contacts in some regions with small features or pitches. Multiple planarization steps may be used during formation of the self-aligned contacts. The present disclosure describes techniques for forming self-aligned contacts for a FinFET device using fewer planarization steps, which results in a greater height of self-aligned dielectric material that remains above the gate stacks of the FinFET device. By reducing the number of planarization steps, the cost and time of processing the FinFET device may be lessened. Additionally, a greater thickness of self-aligned dielectric material over the gate stacks allows for more process variation without increased risk of processing-related yield loss. The greater thickness of self-aligned dielectric material can also improve yield by reducing the risk of electrical shorts being formed during processing.

In accordance with some embodiments of the present disclosure, a method includes forming a semiconductor fin over a substrate, forming a first gate stack and a second gate stack over the semiconductor fin, the first gate stack and the second gate stack surrounded by an interlayer dielectric (ILD), forming a first dielectric material on the first gate stack and on the second gate stack, wherein a top surface of the first dielectric material is a first height above the substrate, performing an etching process to form a first opening in the ILD adjacent the first gate stack and a second opening in the ILD adjacent the second gate stack, wherein after the etching process, a top surface of the first dielectric material on the first gate stack is a second height above the substrate that is less than the first height, forming a first conductive material in the first opening to form a first contact plug and in the second opening to form a second contact plug, forming a second dielectric material over the first contact plug and over the second contact plug, and performing a planarization process on the second dielectric material, wherein after the planarization process the first conductive material of the second contact plug is exposed and the first conductive material of the first contact plug is covered by the second dielectric material. In an embodiment, forming a first conductive material in the first opening and in the second opening includes depositing the first conductive material over the first dielectric material on the first gate stack and over the first dielectric material on the second gate stack, wherein a top surface of the first conductive material over the first dielectric material on the first gate stack is a fifth height above the substrate that is between the second height and the first height. In an embodiment, the method includes recessing the first conductive material to expose the first dielectric material on the first gate stack and the first dielectric material on the second gate stack. In an embodiment, after performing the planarization process on the second dielectric material, a top surface of the first conductive material of the second contact plug is level with a top surface of the second dielectric material covering the first contact plug. In an embodiment, the method includes removing the second dielectric material to expose the first contact plug and depositing a second conductive material on the exposed first contact plug. In an embodiment, the first gate stack is one of multiple first gate stacks having a first pitch, wherein the second gate stack is one of multiple second gate stacks having a second pitch, wherein the first pitch is smaller than the second pitch. In an embodiment, the first dielectric material is different from the second dielectric material. In an embodiment, the method includes forming a first source/drain region in the semiconductor fin adjacent the first gate stack, wherein the first contact plug makes electrical connection to the first source/drain region. In an embodiment, after the etching process, a top surface of the first dielectric material on the second gate stack is the first height above the substrate.

In accordance with some embodiments of the present disclosure, a method includes forming a first gate stack over a first fin and a second gate stack over a second fin, depositing a first dielectric material over the first gate stack and over the second gate stack, forming a first opening in the first dielectric material adjacent the first gate stack and a second opening in the first dielectric material adjacent the second gate stack, etching the first dielectric material over the first gate stack, wherein the etching forms a recess in the first dielectric material having a first depth, and forming a first contact in the first opening and a second contact in the second opening, which includes depositing a conductive material in the first opening and in the second opening, wherein the conductive material has a first height above the first opening that is less than the first depth, depositing a second dielectric material over the conductive material in the first opening and over the conductive material in the second opening, and using a planarization process, removing the second dielectric material over the conductive material in the second opening. In an embodiment, the second dielectric material extends over the first gate stack and over the second gate stack, wherein a top surface of the second dielectric material over the first gate stack is lower than a top surface of the second dielectric material over the second gate stack. In an embodiment, after performing the planarization process, the conductive material in the first opening remains covered by the second dielectric material. In an embodiment, after performing the planarization process, the first dielectric material within the first opening has a thickness above the first gate stacks that is between 50 Å and 500 Å. In an embodiment, the method includes recessing the conductive material prior to depositing the second dielectric material. In an embodiment, after recessing the conductive material, the first dielectric material over the second gate stack is thicker than the first dielectric over the first gate stack. In an embodiment, the method includes forming a first epitaxial source/drain region in the first fin and a second epitaxial source/drain region in the second fin, wherein the first opening exposes the first epitaxial source/drain region and the second opening exposes the second epitaxial source/drain region.

In accordance with some embodiments of the present disclosure, a device includes a semiconductor fin protruding from a substrate, a first gate stack over the semiconductor fin and a second gate stack over the semiconductor fin, a first source/drain region in the semiconductor fin adjacent the first gate stack and a second source/drain region in the semiconductor fin adjacent the second gate stack, a first layer of a first dielectric material on the first gate stack and a second layer of the first dielectric material on the second gate stack, a first source/drain contact on the first source/drain region and adjacent the first gate stack, a first layer of a second dielectric material on a top surface of the first source/drain contact, and a second source/drain contact on the second source/drain region and adjacent the second gate stack, wherein the top surface of the second source/drain contact is free of the second dielectric material. In an embodiment, the second source/drain contact extends higher than the first source/drain contact. In an embodiment, the first dielectric material is different than the second self-aligned dielectric material. In an embodiment, the first dielectric material has a height above the substrate between 50 Å and 500 Å. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a semiconductor fin over a substrate;
    forming a first gate stack and a second gate stack over the semiconductor fin, the first gate stack and the second gate stack surrounded by an interlayer dielectric (ILD);
    forming a first dielectric material on the first gate stack and on the second gate stack, wherein a first top surface of the first dielectric material on the second gate stack is at a first height above the substrate;
    performing an etching process to form a first opening in the ILD adjacent the first gate stack and a second opening in the ILD adjacent the second gate stack, wherein after the etching process, a second top surface of the first dielectric material on the first gate stack is at a second height above the substrate that is less than the first height;
    forming a first conductive material in the first opening to form a first contact plug and in the second opening to form a second contact plug;
    forming a second dielectric material over the first contact plug and over the second contact plug; and
    performing a planarization process on the second dielectric material, wherein after the planarization process the first conductive material of the second contact plug is exposed and the first conductive material of the first contact plug is covered by the second dielectric material.

2. The method of claim 1, wherein forming a first conductive material in the first opening and in the second opening comprises depositing the first conductive material over the first dielectric material on the first gate stack and over the first dielectric material on the second gate stack, wherein a top surface of the first conductive material over the first dielectric material on the first gate stack is a third height above the substrate that is between the second height and the first height.

3. The method of claim 2, further comprising, prior to forming the second dielectric material, recessing the first conductive material to expose the first dielectric material on the first gate stack and the first dielectric material on the second gate stack.

4. The method of claim 1, wherein after performing the planarization process on the second dielectric material, a top surface of the first conductive material of the second contact plug is level with a top surface of the second dielectric material covering the first contact plug.

5. The method of claim 1, further comprising removing the second dielectric material to expose the first contact plug and depositing a second conductive material on the exposed first contact plug.

6. The method of claim 1, wherein the first gate stack is one of a plurality of first gate stacks having a first pitch, wherein the second gate stack is one of a plurality of second gate stacks having a second pitch, wherein the first pitch is smaller than the second pitch.

7. The method of claim 1, wherein the first dielectric material is different from the second dielectric material.

8. The method of claim 1, further comprising forming a first source/drain region in the semiconductor fin adjacent the first gate stack, wherein the first contact plug is formed to make electrical connection to the first source/drain region.

9. The method of claim 1, wherein after the etching process, the first top surface of the first dielectric material on the second gate stack is at the first height above the substrate.

10. A method, comprising:
   forming a first gate stack over a first fin and a second gate stack over a second fin;
   forming an inter-layer dielectric (ILD) layer adjacent the first gate stack and adjacent the second gate stack;
   depositing a first dielectric material over the first gate stack and over the second gate stack, wherein a first top surface of the first dielectric material is at a first height;
   forming a first opening in the first dielectric material by removing a portion of the ILD layer adjacent the first gate stack and a second opening in the ILD layer adjacent the second gate stack;
   etching the first dielectric material, wherein the etching forms a recess in the first dielectric material over the first gate stack, wherein a second top surface of the first dielectric material within the recess is at a second height, wherein the second height is lower than the first height; and
   forming a first contact in the first opening and a second contact in the second opening, comprising:
      depositing a conductive material in the first opening and in the second opening, wherein a top surface of the conductive material in the first opening is at a third height, wherein the third height is between the first height and the second height;
      depositing a second dielectric material over the conductive material in the first opening and over the conductive material in the second opening; and
      using a planarization process, removing the second dielectric material over the conductive material in the second opening.

11. The method of claim 10, wherein the second dielectric material prior to the planarization process extends over the first gate stack and over the second gate stack, and a top surface of the second dielectric material over the first gate stack is lower than a top surface of the second dielectric material over the second gate stack.

12. The method of claim 10, wherein after performing the planarization process, the conductive material in the first opening remains covered by the second dielectric material.

13. The method of claim 12, wherein after performing the planarization process, the first dielectric material within the first opening has a thickness above the first gate stack that is between 50 Å and 500 Å.

14. The method of claim 10, further comprising recessing the conductive material prior to depositing the second dielectric material.

15. The method of claim 10, wherein after recessing the conductive material, the first dielectric material over the second gate stack is thicker than the first dielectric material over the first gate stack.

16. The method of claim 10, further comprising forming a first epitaxial source/drain region in the first fin and a second epitaxial source/drain region in the second fin, wherein forming the first opening exposes the first epitaxial source/drain region and forming the second opening exposes the second epitaxial source/drain region.

17. A method, comprising:
   forming a semiconductor fin protruding from a substrate;
   forming a first gate stack over a first portion of the semiconductor fin and a second gate stack over a second portion of the semiconductor fin;
   forming a first source/drain region in the semiconductor fin adjacent the first gate stack and a second source/drain region in the semiconductor fin adjacent the second gate stack;
   forming a first layer of a first dielectric material on the first gate stack and a second layer of the first dielectric material on the second gate stack, wherein the second layer has a thickness that is greater than the thickness of the first layer;
   forming a first source/drain contact on the first source/drain region and adjacent the first gate stack;
   forming a second source/drain contact on the second source/drain region and adjacent the second gate stack; and
   after forming the first source/drain contact and the second source/drain contact, forming a first layer of a second dielectric material on a top surface of the first source/drain contact, wherein a top surface of the second source/drain contact is free of the second dielectric material, wherein the second source/drain contact extends higher above the substrate than the first source/drain contact.

18. The method of claim 17, wherein the first dielectric material is different than the second dielectric material.

19. The method of claim 17, wherein the first dielectric material has a height above the substrate that is between 50 Å and 500 Å.

20. The method of claim 17, wherein a top surface of the second dielectric material and the top surface of the second source/drain contact are level.

\* \* \* \* \*